US012607673B2

(12) United States Patent
Abraham et al.

(10) Patent No.: US 12,607,673 B2
(45) Date of Patent: Apr. 21, 2026

(54) MODULAR SCAN DATA NETWORK FOR HIGH SPEED SCAN DATA TRANSFER

(71) Applicant: QUALCOMM INCORPORATED, San Diego, CA (US)

(72) Inventors: Jais Abraham, Bangalore (IN); Arvind Jain, San Diego, CA (US); Rajeev Komalan Nair, Bangalore (IN); Basim Mohammed Issa Shanyour, San Diego, CA (US); Madan Krishnappa, San Diego, CA (US)

(73) Assignee: Qualcomm Incorporated, San Diego, CA (US)

( * ) Notice: Subject to any disclaimer, the term of this patent is extended or adjusted under 35 U.S.C. 154(b) by 34 days.

(21) Appl. No.: 18/725,676

(22) PCT Filed: Feb. 24, 2023

(86) PCT No.: PCT/US2023/063284
§ 371 (c)(1),
(2) Date: Jun. 28, 2024

(87) PCT Pub. No.: WO2023/164659
PCT Pub. Date: Aug. 31, 2023

(65) Prior Publication Data
US 2025/0180645 A1       Jun. 5, 2025

(30) Foreign Application Priority Data
Feb. 28, 2022     (IN) .............................. 202241010891

(51) Int. Cl.
*G01R 31/3185*       (2006.01)
*G01R 31/317*        (2006.01)
*G06F 13/40*         (2006.01)

(52) U.S. Cl.
CPC ................ *G01R 31/318536* (2013.01); *G01R 31/31723* (2013.01); *G01R 31/31724* (2013.01);
(Continued)

(58) Field of Classification Search
CPC ...... G01R 31/318536; G01R 31/31723; G01R 31/31724; G01R 31/31725;
(Continued)

(56) References Cited

U.S. PATENT DOCUMENTS 5,627,842 A       5/1997   Brown et al.
10,476,740 B1 *  11/2019   Cote ....................... G06F 30/33
(Continued)

OTHER PUBLICATIONS

Jean-Francois Cote et al., Streaming Scan Network (SSN): An Efficient Packetized Data Network for Testing Complex SoCs, 2020 IEEE International Test Conference (Itc), Nov. 1, 2020, 10 pages, pp. 1-10, XP033880804.
(Continued)

*Primary Examiner* — John J Tabone, Jr.
(74) *Attorney, Agent, or Firm* — Smith Tempel Blaha LLC

(57)               ABSTRACT

Scan testing features on a chip may include a streaming scan network (SSN) with core streaming scan hubs (CSHs). A CSH may include a parent bus interface, a child bus interface, and a streaming scan hub (SSH). A CSH may also include multiplexing logic configured to select whether the child bus interface is included in the SSN or excluded from the SSN. Multiple CSHs may be interconnected in a hierarchical topology through the child bus interfaces.

16 Claims, 16 Drawing Sheets

(52) U.S. Cl.
CPC .................. *G01R 31/31725* (2013.01); *G01R 31/318555* (2013.01); *G01R 31/318558* (2013.01); *G06F 13/4022* (2013.01)

(58) Field of Classification Search
CPC .... G01R 31/318555; G01R 31/318558; G06F 13/4022
USPC ....................................... 714/726, 727, 729
See application file for complete search history.

(56) References Cited

U.S. PATENT DOCUMENTS

| | | |
|---|---|---|
| 2009/0193306 A1 | 7/2009 | Chakraborty et al. |
| 2016/0259000 A1* | 9/2016 | Robbins ......... G01R 31/318583 |
| 2025/0180645 A1* | 6/2025 | Abraham ............ G06F 13/4022 |

OTHER PUBLICATIONS

Related PCT Pat. App. Ser. No. PCT/US2023/063284, filed Feb. 24, 2023, entitled Modular Scan Data Network for High Speed Scan Data Transfer, International Search Report and the Written Opinion of the International Searching Authority (ISA)(EPO), issued Jun. 15, 2023, 16 pages; application is published as WO2023-164659 on Aug. 31, 2023.

* cited by examiner

MODULAR SCAN DATA NETWORK FOR HIGH SPEED SCAN DATA TRANSFER

DESCRIPTION OF THE RELATED ART

A computing device may include multiple subsystems, cores, or other components. Such a computing device may be, for example, a portable computing device ("PCD"), such as a laptop or palmtop computer, a cellular telephone or smartphone, portable digital assistant, portable game console, etc. The multiple subsystems, cores or other components of a computing device may be included within different chips or in the same integrated circuit chip. A "system-on-a-chip" or "SoC" is an example of one such chip that integrates numerous components to provide system-level functionality. For example, an SoC may include one or more types of processors, such as central processing units ("CPU"s), graphics processing units ("GPU"s), digital signal processors ("DSP"s), and neural processing units ("NPU"s). An SoC may include other processing subsystems, such as a transceiver or "modem" subsystem that provides wireless connectivity, a memory subsystem, etc.

Testing a complex chip such as an SoC presents challenges. A traditional design-for-test ("DFT") technique is to provide scan chains in the functional circuitry. Registers in the functional circuitry are connected in a scan chain, and multiplexers are included to enable inserting test data into register inputs and reading test results from register outputs. The test data and test results are linked into shift registers. To perform a test of the chip functional circuitry, test vectors are provided to chip input pins, shifted into the scan chain, and functional clock signals are pulsed to exercise the register logic. Then, in a capture phase, the results are shifted out to chip output pins and compared against a vector of expected results. In another traditional DFT technique, built-in self-test ("BIST"), logic is included on the chip to generate the test patterns and compare the test results with the expected results.

One challenge in testing complex chips such as SoCs is obtaining high throughput, i.e., transferring test vectors and test results on and off a chip, respectively, at high speed so that the chip can be tested rapidly. Embedded Deterministic Testing ("EDT") also known in the art as Scan Compression Testing (SCT) is a hybrid DFT technique that combines aspects of traditional scan chain methods with some aspects of BIST. In EDT, an EDT controller on the chip uses the test vector to generate a larger amount of test data that it feeds to the scan chains. EDT enables test vectors and test result to be transferred on and off the chip, respectively, at a higher speed while the scan chains may be operated at a lower speed of the functional logic under test. While EDT may addresses an aspect of the throughput problem, it would be desirable to provide additional DFT improvements along with higher throughput in testing complex chips such as SoCs.

SUMMARY OF THE DISCLOSURE

Systems, methods, computer-readable media, and other examples are disclosed for scan testing on an integrated circuit chip, such as an SoC.

An exemplary system for scan testing on a chip may include a streaming scan bus and a plurality of core streaming scan hubs (CSHs). The CSHs may be coupled in a ring topology by portions of the streaming scan bus, forming a ring data network. Each of the CSHs may include a parent bus interface and a child bus interface. Each of the CSHs may also include a streaming scan hub (SSH) coupled to the parent bus interface and configured to transmit chip test scan data to and receive chip test scan results from a test controller. Each of the CSHs may further include multiplexing logic configured to selectably include the child bus interface in the ring data network and selectably exclude the child bus interface from the ring data network. The parent bus interface of one of the CSHs may be coupled to an off-chip interface of the chip.

An exemplary CSH may include a parent bus interface, a streaming scan hub ("SSH"), and a child bus interface. The parent bus interface may be configured to transmit and receive data via a streaming scan bus. The SSH may be configured to transmit chip test scan data to and receive chip test scan results from a test controller. The child bus interface may be configured to transmit and receive data via the streaming scan bus. The CSH may further include multiplexing logic configured to selectably couple the child bus interface to the parent bus interface and the SSH and selectably isolate the child bus interface from the parent bus interface and the SSH.

An exemplary method for scan testing on a chip may include receiving scan test data at an off-chip interface. The method may further include providing the scan test data to a parent bus interface of a CSH in a ring data network. The method may also include providing the scan test data from the parent bus interface to an SSH of the CSH. The method may yet further include selectably providing the scan test data in the CSH to a child bus interface of the CSH, including configuring multiplexing logic of the CSH to selectably include the child bus interface in the ring data network or selectably exclude the child bus interface from the ring data network.

Another exemplary system for scan testing on a chip may include means for receiving scan test data by an off-chip interface of the chip. The system may further include means for providing the scan test data to a parent bus interface of a CSH of a ring data network. The system may also include means for providing the scan test data from the parent bus interface to an SSH of the CSH. The system may still further include means for selectably providing the scan test data in the CSH to a child bus interface of the CSH. The means for selectably providing the scan test data may include means for configuring multiplexing logic of the CSH to selectably include the child bus interface in the ring data network or selectably exclude the child bus interface from the ring data network.

BRIEF DESCRIPTION OF THE DRAWINGS

In the Figures, like reference numerals refer to like parts throughout the various views unless otherwise indicated. For reference numerals with letter character designations such as "102A" or "102B", the letter character designations may differentiate two like parts or elements present in the same Figure. Letter character designations for reference numerals may be omitted when it is intended that a reference numeral to encompass all parts having the same reference numeral in all Figures.

DETAILED DESCRIPTION

The word "exemplary" is used herein to mean "serving as an example, instance, or illustration." The word "illustrative" may be used herein synonymously with "exemplary." Any aspect described herein as "exemplary" is not necessarily to be construed as preferred or advantageous over other aspects.

Figure 1:
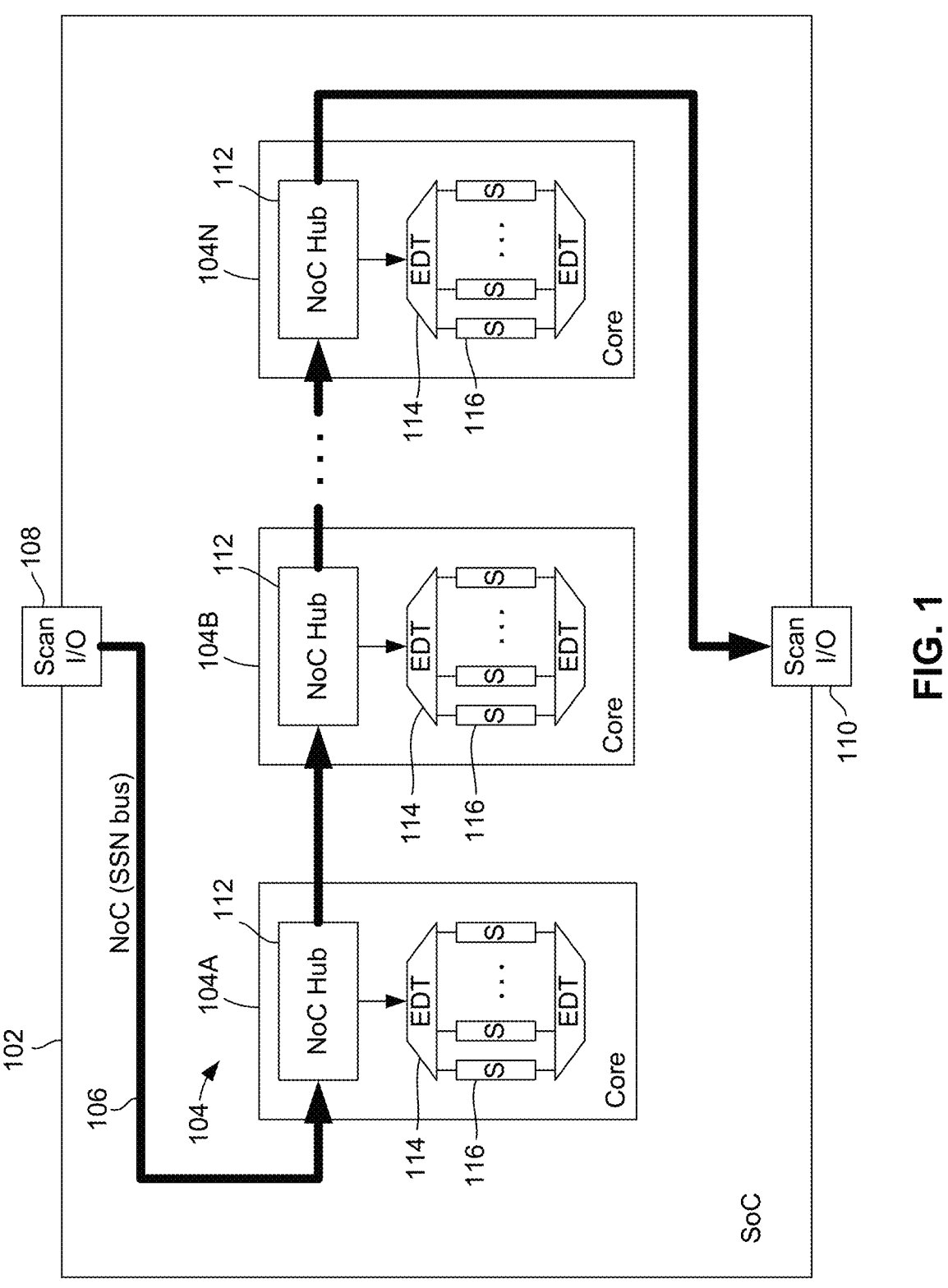
FIG. 1 is block diagram illustrating a system-on-a-chip ("SoC") having a streaming scan network ("SSN") with a ring topology, in accordance with exemplary embodiments.

As shown in FIG. 1, a system-on-a-chip ("SoC") 102 may include two or more cores 104, such as cores 104A, 104B, etc., through 104N. A streaming scan bus 106, which may also be referred to as a network-on-a-chip or "NoC," may interconnect the cores 104 in a packetized data network. "Streaming scan" may also be known in the art as a "high speed scan." It is recognized that "high speed" is a relative term and will be explained below in terms of the "streaming scan."

The packetized data network may be referred to as a streaming scan network or "SSN" or high speed scan network or "HSSN." The cores 104 may be interconnected by portions of the streaming scan bus 106 in a ring topology, which is depicted in a simplified form in FIG. 1 for purposes of clarity. The arrows between the cores 104 indicate portions of the streaming scan bus 106 and the direction of packet transmission on that portion between SSN inputs and SSN outputs of the various cores 104. The SSN input of the first core 104A may be coupled via a portion of the streaming scan bus 106 to an off-chip scan input/output ("I/O") connection 108 (e.g., pin) of the SoC 102. The SSN output of the last core 104N may be coupled via another portion of the streaming scan bus 106 to another off-chip scan I/O connection 110 of the SoC 102. Still another core 104, such as the core 104B may have an SSN input coupled to an SSN output of the previous core 104A in the network and have an SSN output coupled to an SSN input of the next core 104 (not shown) in the network.

Each core 104 may include a NoC hub 112 that is configured to receive data packets via the core's input node and output data packets via the core's data output node. The packet payload (i.e., data) may be configured in a manner that enables each core 104 to determine whether the packet contains data destined for the core 104. The received data packets may contain scan test data, and the output data packets may contain scan test results. Each core 104 thus receives all data packets that are transmitted through the network but only utilizes the scan test data destined for that core and does not utilize scan test data destinated for another core.

Each core 104 may also include an Embedded Deterministic Test ("EDT") or Scan Compression Test ("SCT") controller 114. As understood by one of ordinary skill in the art, the EDT controller 114 may be configured to test the operation of functional logic of the core 104 arranged in configurations known as scan chains 116. The EDT controller 114 may have a first portion coupled to a first end of one or more scan chains 116. This first portion of the EDT controller 114 may be configured to decompress or unpack received test data, provide the test data to the scan chains 116, and otherwise control the stimulus aspects of the testing. The EDT controller 114 may have a second portion coupled to a second end of the same scan chains 116. This second portion of the EDT controller 114 may be configured to obtain test result data from the scan chains 116 and otherwise control the response or results-capture aspects of the testing. The EDT controller 114 may then provide the test result data to the NoC hub 112, which may packetize the test result data and output the resulting data packets to the streaming scan bus 106. As testing the functional logic of an SoC core using EDT and streaming scan network techniques is well understood by one of ordinary skill in the art, such aspects are not described herein in further detail.

Figure 2:
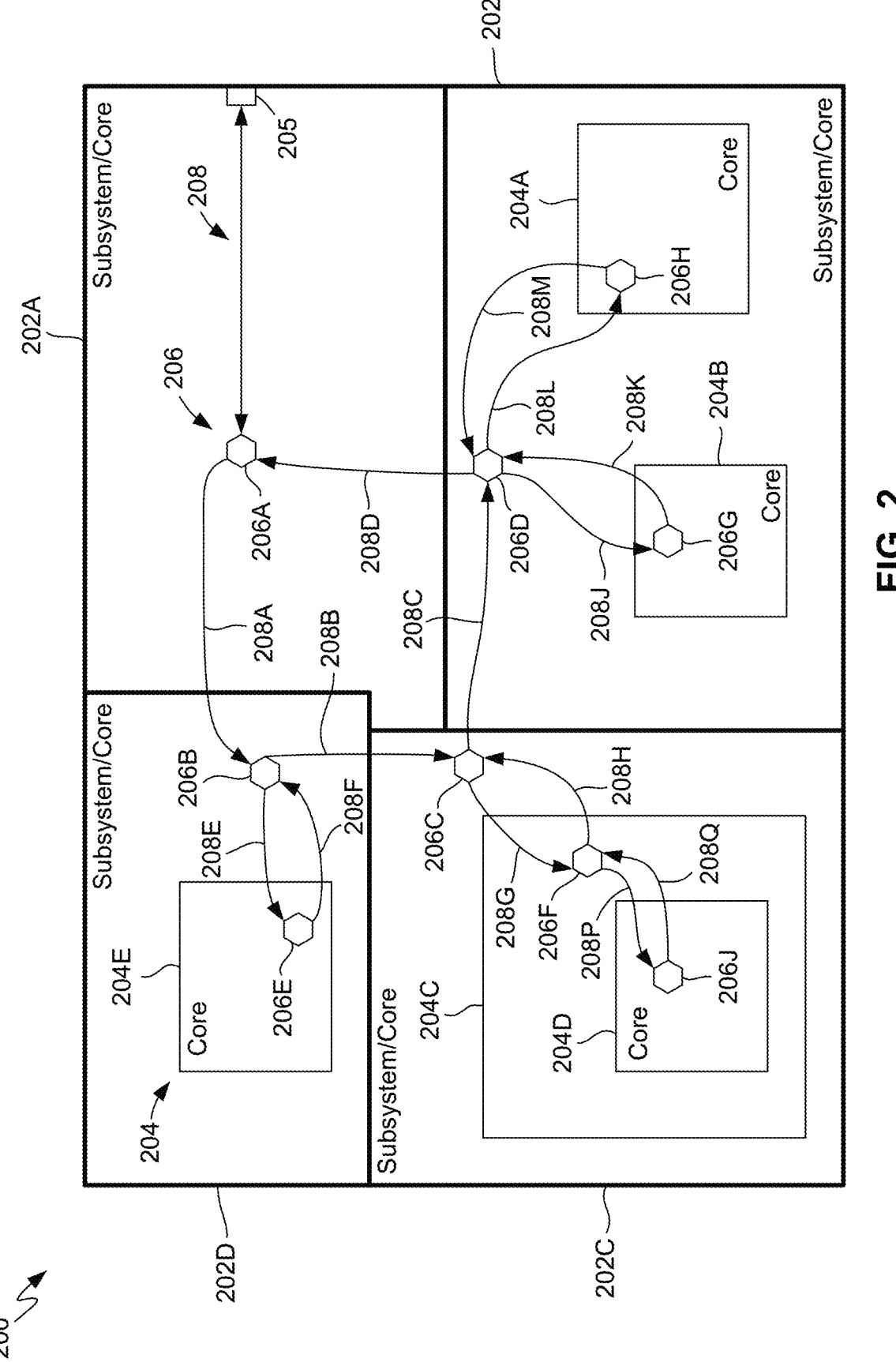
FIG. 2 is a block diagram illustrating a hierarchically configured streaming scan ring network in an SoC, in accordance with exemplary embodiments.

As shown in FIG. 2, an SoC 200 may include any number of cores 202A, 202B, 202C, 202D, etc., each of which may include any number of sub-cores 204. For example: the core 202B may include sub-cores 204A and 204B; the core 202C may include the sub-cores 204C and 204D (where the sub-core 204D is embedded in the sub-core 204C); and the core 202D may include the core sub-core 204E. In some examples, the higher-level cores 202A, 202B, 202C and 202D may form subsystems of the SoC 200.

The cores 202, sub-cores 204 or other portions of the SoC 200 may include any number of core streaming scan hubs ("CSH"s) 206 (represented in FIG. 2 by hexagonal symbols). The CSHs 206 may be interconnected by portions of a streaming scan bus (or SSN bus) in the manner described above with regard to FIG. 1. That is, a ring data network may be formed in which some or all of the CSHs 206 are coupled in a ring topology by portions (or paths) of the SSN bus. Note, for example, the ring topology formed by: an SSN output of a first CSH 206A, which is in the core 202A, may be coupled via a path 208A to an SSN input of second CSH 206B, which is in the core 202D; an SSN output of the second CSH 206B may be coupled via a path 208B to an SSN input of third CSH 206C, which is in the core 202C; an SSN output of the third CSH 206C may be coupled via a path 208C to an SSN input of fourth CSH 206D, which is in the core 202B; and an SSN output of the fourth CSH 206D may be coupled via a path 208D to an SSN input of the first CSH 206A. One of the CSHs 206, such as the first CSH 206A in the illustrated example, may be coupled to off-chip scan I/O connections 205 of the SoC 200. For reasons that will become more apparent in view of descriptions below relating to a network hierarchy, the first CSH 206A (i.e., that which is configured to transfer data on and off the chip) may be referred to as the parent CSH in the highest level in the network, and other CSHs 206 may be referred to as child CSHs in various levels of the network.

Some CSHs 206 may be configured to provide additional levels in the ring network. For example, whereas the first CSH 206A, the second 206B, the third CSH 206C and the fourth CSH 206D may be coupled in a first-level (highest-level) ring topology, the second CSH 206B and a fifth CSH 206E may be coupled in a second-level ring topology. That is, an SSN output of the second CSH 206B may be coupled via a path 208E to an SSN input of the fifth CSH 206E, which is in the core 204E, and an SSN output of the fifth CSH 206E may be coupled via a path 208F to an SSN input of the second CSH 206B. In another example of a second-level ring topology, an SSN output of the third CSH 206C may be coupled via a path 208G to an SSN input of a sixth CSH 206F, which is in the core 204C, and an SSN output of the sixth CSH 206F may be coupled via a path 208H to an SSN input of the third CSH 206C. In yet another example of a second-level ring topology, an SSN output of the fourth CSH 206D may be coupled via a path 208J to an SSN input of a seventh CSH 206G, which is in the core 204B, and an SSN output of the seventh CSH 206G may be coupled via a path 208K to an SSN input of the fourth CSH 206D. In still another example of a second-level ring topology, an SSN output of the fourth CSH 206D may be coupled via a path 208L to an SSN input of an eighth CSH 206H, which is in the core 204A, and an SSN output of the eighth CSH 206H may be coupled via a path 208M to an SSN input of the fourth CSH 206D.

Still further levels may be provided in the ring network. For example, whereas the third CSH 206C and the sixth CSH 206F may be coupled in a second-level ring topology, the sixth CSH 206F and a ninth CSH 206J, which is in the core 204D, may be coupled in a third-level ring topology. That is, an SSN output of the sixth CSH 206F may be coupled via a path 208P to an SSN input of the ninth CSH 206J, and an SSN output of the ninth CSH 206J may be coupled via a path 208Q to an SSN input of the sixth CSH 206F.

The various CSHs 206 may be identical in structure, thereby enhancing modularity. For example, the same hierarchical arrangement of CSHs that is employed to test a functional circuitry module in one portion of the chip, such as a core, may be employed to test an identical functional circuitry module in another portion of the chip, such as another core.

Figure 3:
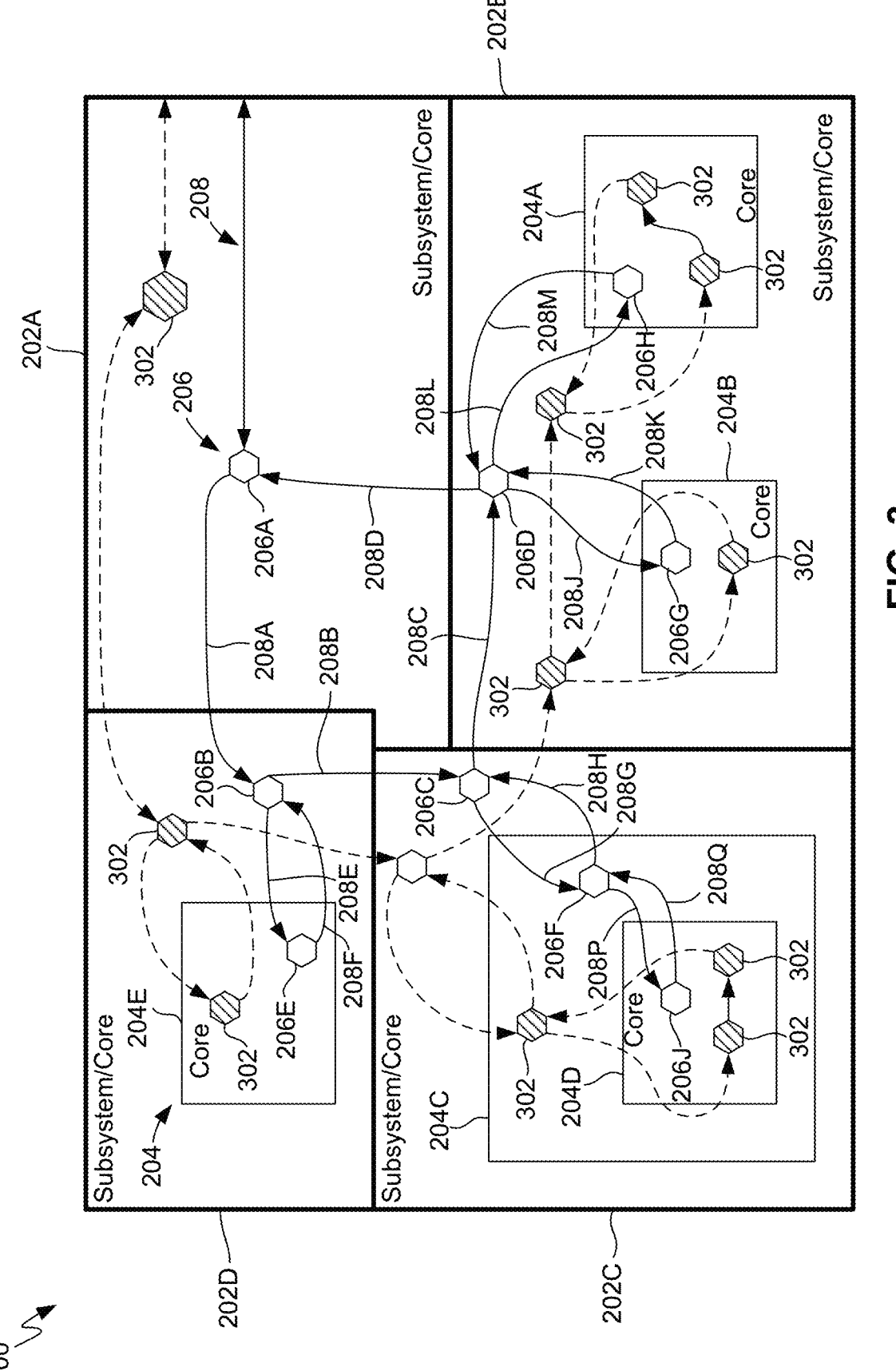
FIG. 3 is similar to FIG. 2 and further shows a control network in the SoC, in accordance with exemplary embodiments.

As shown in FIG. 3, an SoC 300 may include a scan control network ("SCN") comprising any number of scan control hubs 302 interconnected by portions or paths of a network bus. The SoC 300 may be an example of the SoC 200 (FIG. 1). Accordingly, elements described above with regard to FIG. 2, such as the cores 202 and 204, the CSHs 206, and the SSN paths 208, are not described in similar detail with regard to FIG. 3. In the SoC 300, the SCN may be included along with, i.e., in addition to, the SSN described above with regard to FIG. 1, comprising the CSHs 206 and interconnecting SSN bus portions or paths 208. In the SCN, paths (indicated in broken line) may similarly interconnect the scan control hubs 302. The scan control hubs 302 may similarly receive packetized data transferred onto the SoC 300 and provide packetized data off the SoC 300. The scan control hubs 302 may be configured to provide control signals to the CSHs 206 based on data received through the SCN.

Figure 4:
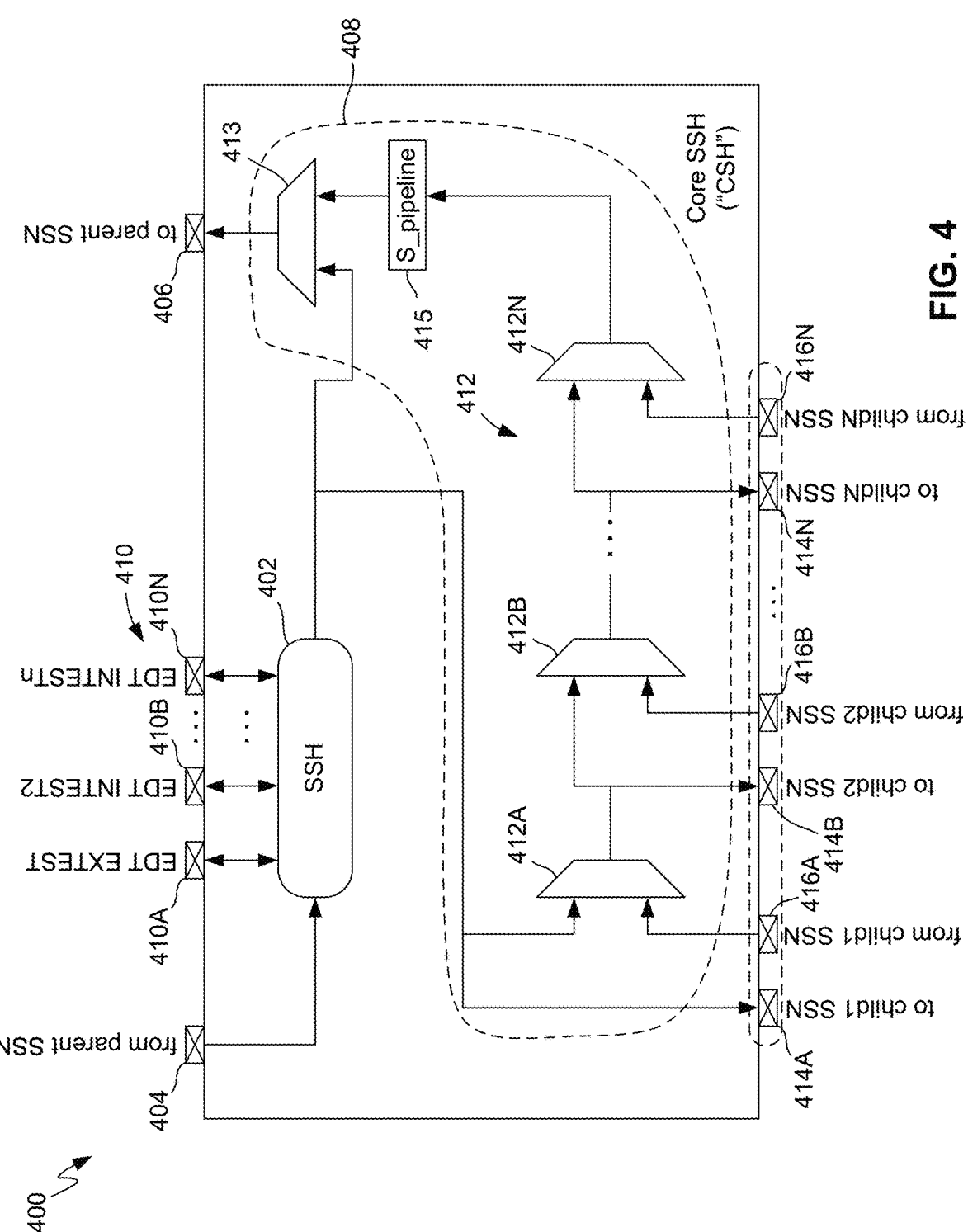
FIG. 4 is a block diagram illustrating a core streaming scan hub ("CSH"), in accordance with exemplary embodiments.

In FIG. 4, a CSH 400 is shown that may be an example of each of the above-described CSHs 206 (FIGS. 2-3). The CSH 400 may include a streaming scan hub ("SSH") 402, also known in the art as a scan network hub ("SNH"). As understood by one of ordinary skill in the art, the SSH 402 may provide an interface between the SSN bus and an EDT test controller (not shown in FIG. 4) in the manner described above with regard to the NoC hub 112 in FIG. 1. Accordingly, the SSH 402 may be configured to receive SSN data from a parent-level data input node 404 of the CSH 400 and provide or output network SSN data to a parent-level data output node 406 of the CSH 400. The SSH 402 may be coupled to the parent-level data output node 406 via multiplexing logic 408 that is further described below. The SSH 402 is a hub that picks up the scan data meant for a core node.

The SSH 402 may also be coupled to EDT controller nodes 410, such as EDT controller nodes 410A, 410B, etc., through 410N. The EDT controller nodes 410 may be bidirectional. The EDT controller nodes 410 may be coupled to an EDT controller (not shown in FIG. 4) in the manner described above with regard to the EDT controller 114 in FIG. 1. As understood by one of ordinary skill in the art, some of the EDT controller nodes 410, such as EDT controller node 410A, may be used to communicate data relating to testing scan chains external to a core and, as such, are commonly referred to as EXTEST channels, while the remainder of the EDT controller nodes 410, such as EDT controller nodes 410B-410N, may be used to communicate data relating to testing scan chains internal to a core and, as such, are commonly referred to as INTEST channels. It should be understood that the descriptions herein of data input and output "nodes," such as the parent-level data input node 404 and the parent-level data output node 406, are not intended to imply a particular structure; the "node" is provided in the drawings figures only for convenience of reference.

The multiplexing logic 408 may include any number N of two-input child bypass data multiplexers ("MUX"es) 412, such as first child bypass MUX 412A, a second child bypass MUX 412B, etc., through an Nth child bypass MUX 412N. It should be understood that the MUXes 412 are "data MUXes," i.e., each of the two inputs of each MUX 412 has the same width as the SSN bus. In an example in which the SSN bus is 32 bits wide, each of the two inputs of each MUX 412 is 32 bits wide.

The child bypass MUXes 412 may be configured together in a chain: the first child bypass MUX 412A may be configured with its first data input coupled to the SSH 402 and configured to receive SSN data from the SSH 402; the second child bypass MUX 412B may be configured with its first data input coupled to the output of the first child bypass MUX 412A; etc., through the Nth child bypass MUX 412N, which may be configured with its first data input coupled to the output of the (N−1)th child bypass MUX (not shown). The output of the Nth child bypass MUX 412N may be multiplexed with the output of the SSH 402 through a parent-level data MUX 413 and coupled to the parent-level data output node 406. A register pipeline 415 comprising any number of data registers (not individually shown) may be interposed for timing purposes in the connection between the output of the child bypass MUX 412N and the parent-level MUX 413.

The parent-level data input node 404 and the parent-level data output node 406 may together be referred to as a parent bus interface of the CSH 400. The CSH 400 may also have a child bus interface, comprising a first child data output node 414A, a first child data input node 416A, a second child data output node 414B, a second child data input node 416B, etc., through an Nth child data output node 414N and an Nth child data input node 416N. The first child data output node 414A may be coupled to the SSH 402 so as to receive SSN data directly from the SSH 402. The second child data output node 414B may be coupled to the output of the first child bypass MUX 412. The remaining child bypass MUXes 412 may coupled together in this manner, with the Nth child data output node 414N coupled to the output of the (N−1)th child bypass MUX (not shown). The first child data input node 416A may be coupled to the second data input of the first child bypass MUX 412A, the second child data input node 416B may be coupled to the second data input of the second child bypass MUX 412B, etc., through the Nth child data input node 416N, which may be coupled to the second data input of the Nth child bypass MUX 412N.

The MUXes 412 may be controlled by the control signals that the CSH 400 may receive via a scan control network or SCN, as described above with regard to FIG. 3. Control signal inputs of the MUXes 412 and 413 (i.e., selector inputs through which one of the two MUX inputs may be selected) are not shown in FIG. 4 for purposes of clarity.

Figure 5:
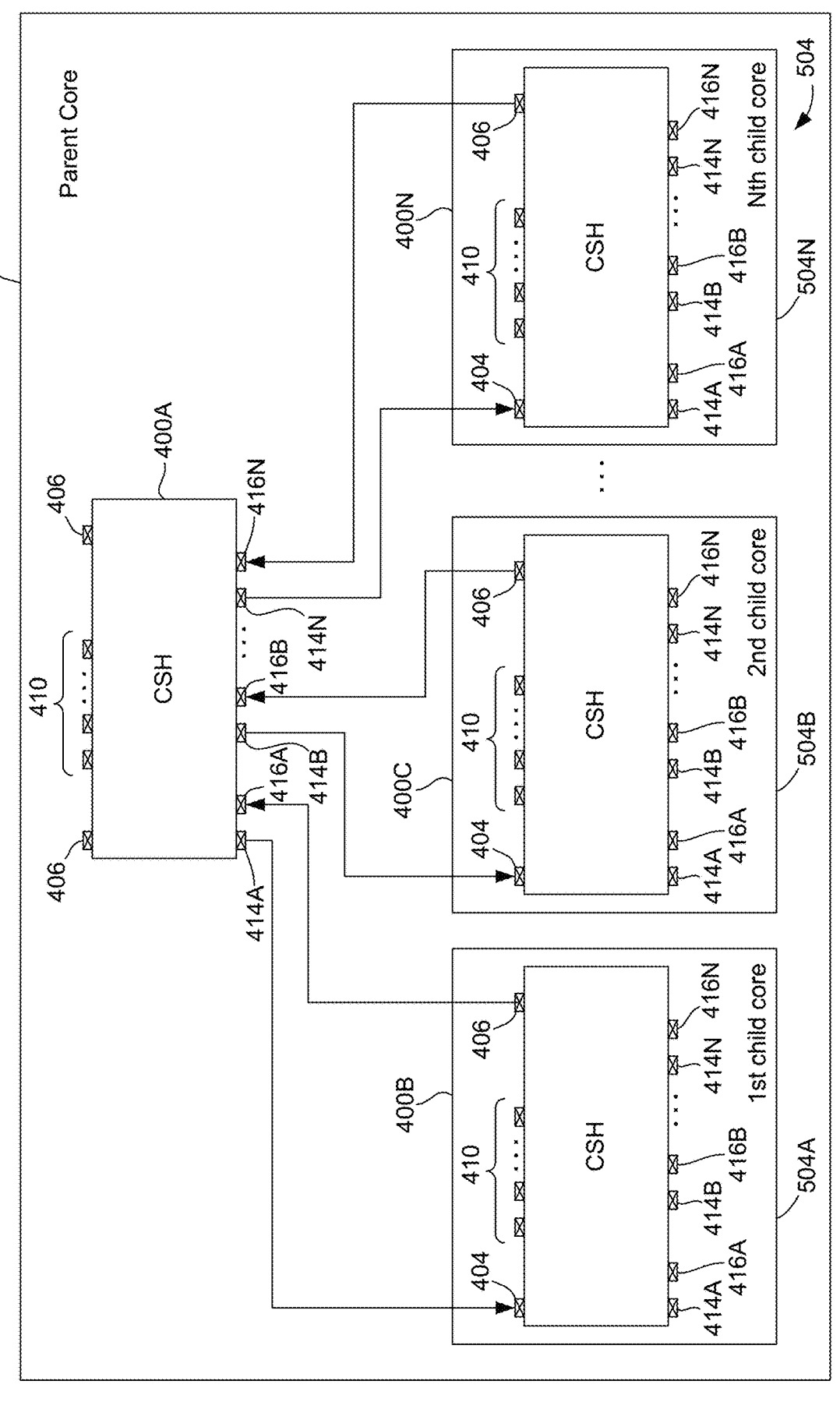
FIG. 5 is a block diagram illustrating a parent-child hierarchy of CSHs, in accordance with exemplary embodiments.

As shown in FIG. 5, a parent core 502 may contain one or more child cores 504, such as a first child core 504A, a second child core 504B, etc., through an Nth child core 504N. This parent-child core hierarchy may be mirrored in a hierarchical architecture or topology of CSHs 400, such as the illustrated CSHs 400A, 400B, 400C, etc., though 400N. The child bus interface of the CSH 400A, which may be referred to as the parent CSH in the illustrated hierarchy example, may be coupled to the parent bus interfaces of the CSHs 400B-400N, which may be referred to as the child CSHs in the illustrated hierarchy example. More particularly in the illustrated example: the child data output node 414A of the parent CSH 400A may be coupled to the parent data input node 404 of the first child CSH 400B; the child data input node 416A of the parent CSH 400A may be coupled to the parent data output node 406 of the first child CSH 400B; the child data output node 414B of the parent CSH 400A may be coupled to the parent data input node 404 of the second child CSH 400C; the child data input node 416B of the parent CSH 400A may be coupled to the parent data output node 406 of the second child CSH 400C, etc.

With additional reference again to FIG. 4, note that by configuring the child bypass MUXes 412, any child CSHs that may be connected to the child bus interface in a particular example may be included in the SSN or excluded from the SSN. That is, by controlling which of the two data inputs of each child bypass MUX 412 associated with a connected child CSH is selected, that child CSH may be included in the SSN or excluded from the SSN (i.e., bypassed). Similarly, by controlling the parent-level MUX 413 all connected child CSHs may be collectively excluded from the SSN.

With still further reference again to FIGS. 2-3, it may be noted that the exemplary hierarchical SSN topology shown in FIGS. 2-3 may be provided by configuring the CSHs 206. Configuring the CSHs 400 (or 206 in the example shown in FIGS. 2-3) so as to configure the overall SSN into a particular topology may enable testing of the functional logic of some cores while disabling or excluding testing of the functional logic of other cores.

Figure 6:
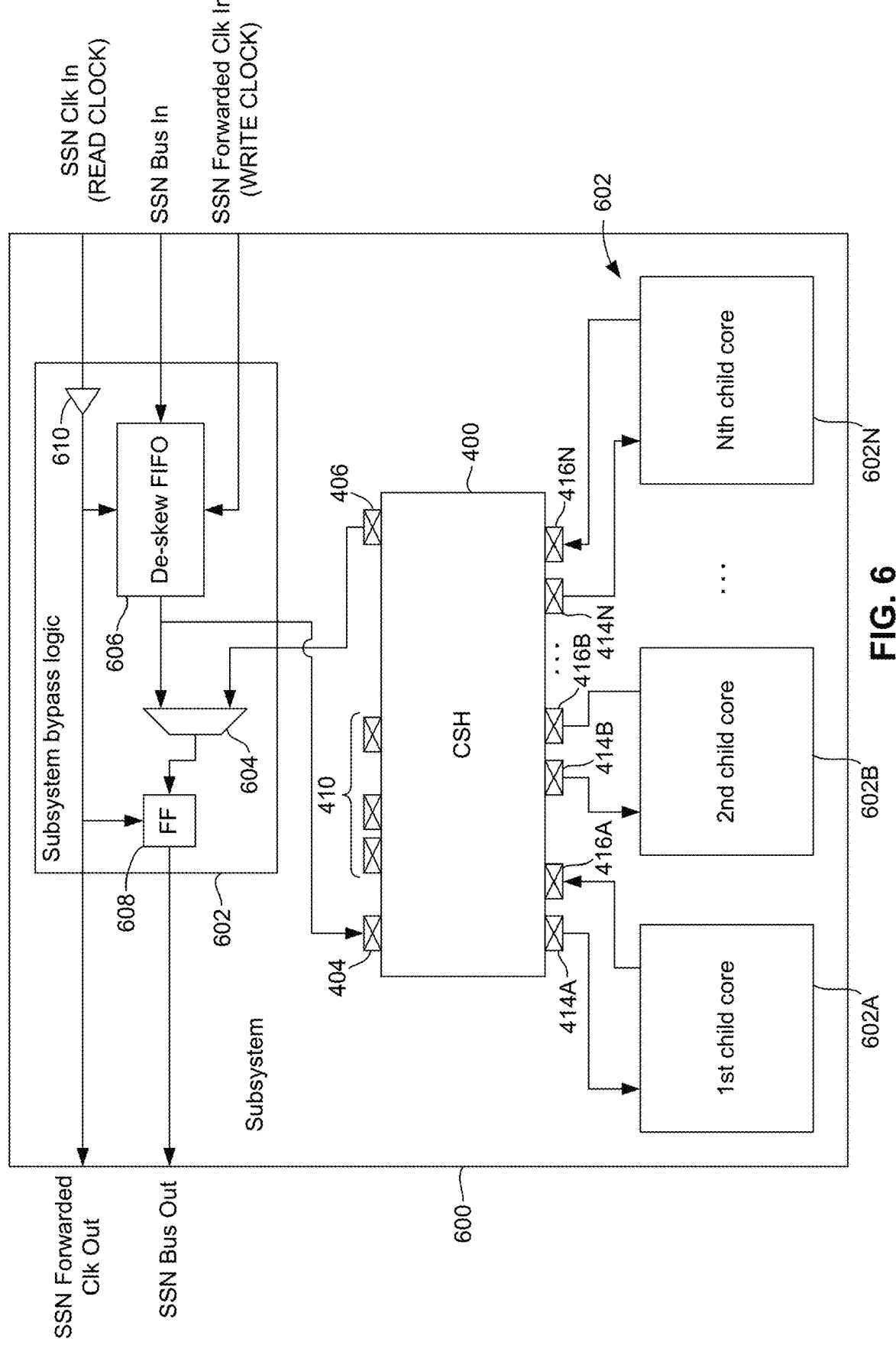
FIG. 6 is a block diagram illustrating an SoC subsystem having bypass logic, in accordance with exemplary embodiments.

As shown in FIG. 6, the CSH 400 may be included in an SoC subsystem ("SS") 600. Although not shown in FIG. 6 for purposes of clarity, the SoC subsystem 600 may be one of multiple SoC subsystems, such as described above with regard to FIG. 2. The CSH 400 may be coupled to one or more child cores 602, such as a first child core 602A, a second child core 602B, etc., through an Nth child core 602N. The child cores 602 may be included in the same SoC subsystem 600 with the CSH 400.

The SoC subsystem 600 may include subsystem bypass logic 602. The subsystem bypass logic 602 may include a two-input data MUX 604, data de-skew FIFO logic 606, and one or more data output flip-flops 608. The subsystem bypass logic 602 may be configured to selectably exclude the CSH 400 (and thus also exclude the child cores 602) from the SSN. The data de-skew FIFO logic 606 may be configured to receive data packets from the SSN ("SSN Bus In") and, using a subsystem-level clock signal ("SSN Forwarded Clk In" or "WRITE CLOCK") that is further described below, clock a data packet through two or more FIFO stages (not individually shown). The data de-skew FIFO logic 606 thus removes skew between the data and the subsystem-level clock signal. The data is clocked out of the FIFO using an SSN clock signal ("SSN Clk In" or "READ CLOCK"). The parent-level data input node 404 of the CSH 400 may be coupled to the output of the data de-skew FIFO logic 606, which is also coupled to a first data input of the MUX 604. The parent-level data output node 406 of the CSH 400 may be coupled to the second data input of the MUX 604. The output of the MUX 604 may be coupled to the input of the flip-flops 608, which may be clocked by the above-referenced SSN clock signal. The output of the flip-flops 608 may provide data packets out of the SoC subsystem 600 on the SSN bus ("SSN Bus Out"). A clock signal buffer 610 may be included between the SSN clock signal ("SSN Clk In" or "READ CLOCK") input to the SoC subsystem 600 and elements in the SoC subsystem 600 that are clocked by the SSN clock signal, such as the data de-skew FIFO logic 606 and the flip-flops 608. The subsystem bypass control logic 602 may be powered by an SoC-wide power supply rail (not shown) rather than a subsystem-specific power supply rail (not shown) so that the subsystem bypass control logic 602 does not turn off when the power supplying the subsystem functional logic (not shown) is gated off.

By configuring the MUX 604, i.e., controlling which of the two data inputs is selected, the SoC subsystem 600 may be included in the SSN or excluded from the SSN (i.e., bypassed). Configuring the subsystem bypass control logic 602 in this manner, so as to include the SoC subsystem 600 in the SSN or exclude the SoC subsystem 600 from the SSN, may correspondingly include or exclude the functional logic (not shown) of the SoC subsystem 600 (and thus the functional logic of the child cores 602 as well) from the SoC scan testing.

Figure 7:
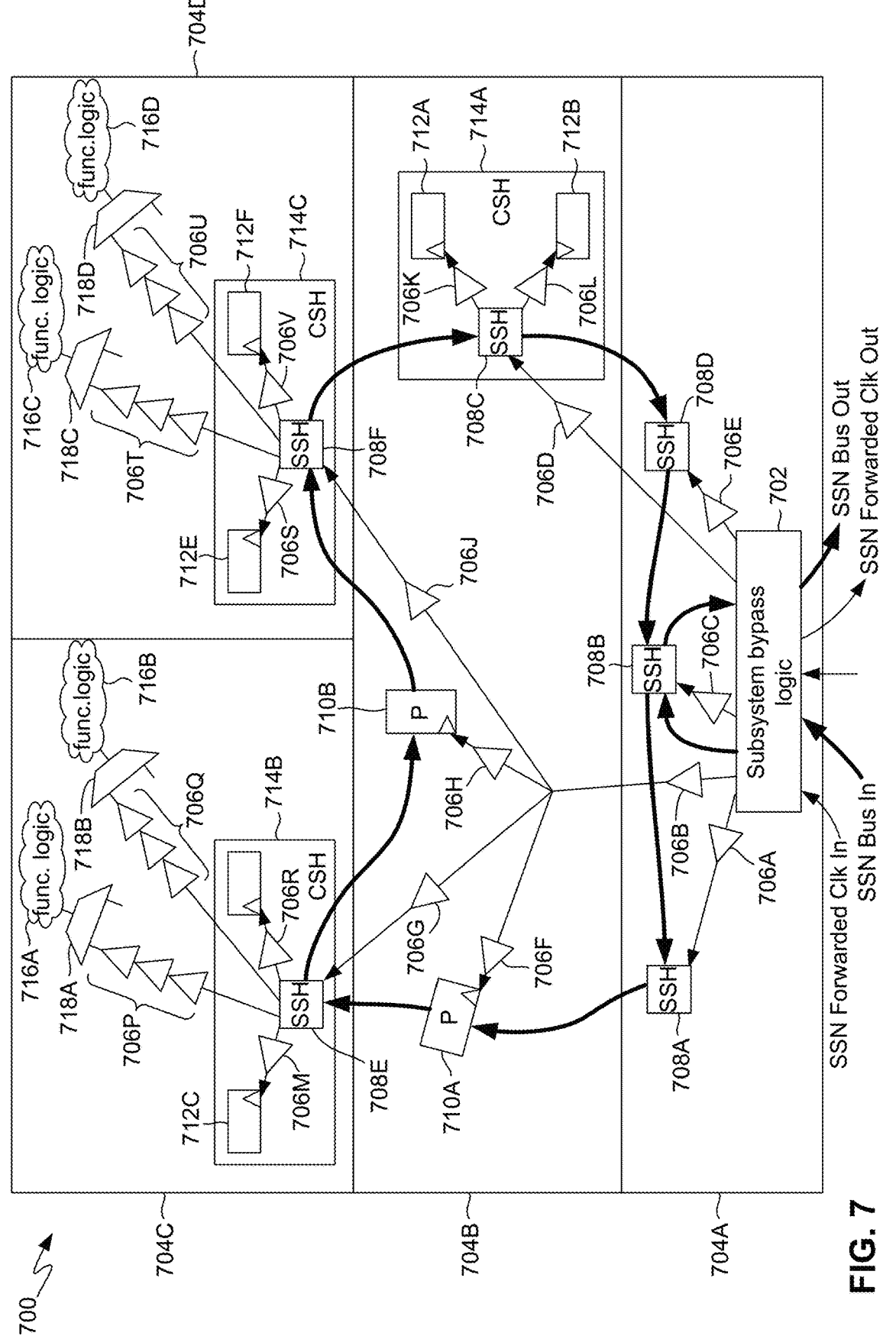
FIG. 7 is a block diagram illustrating a clock signal distribution tree among multiple SoC subsystems, in accordance with exemplary embodiments.

As shown in FIG. 7, a subsystem 700 may include subsystem bypass control logic 702. The subsystem bypass control logic 702 may be similar to the above-described subsystem bypass control logic 602 (FIG. 6). The subsystem 700 may include any number of cores, such as a first core 704A, a second core 704B, a third core 704C and a fourth core 704D. In the illustrated hierarchy, the second core 704B may be a child of the first core 704A, and each of the third core 704C and the fourth core 604D may be a child of the second core 704B. Nevertheless, in other examples such cores may have any other hierarchical arrangement.

The subsystem bypass control logic 702 may be configured to receive a clock signal ("SSN Forwarded Clk In") from another subsystem (not shown) and likewise to provide a clock signal ("SSN Forwarded Clk Out") to still another subsystem (not shown), in the manner described above with regard to the subsystem 600 and similar clock signals in FIG. 6. The subsystem bypass control logic 702 may similarly be configured to receive data from another subsystem ("SSN Bus In") and provide data to another subsystem ("SSN Bus Out") in the manner described above with regard to FIG. 6.

In the subsystem 700, a clock signal tree may be rooted in the subsystem bypass control logic 702. That is, the subsystem bypass control logic 702 may feed or distribute the above-referenced clock signal to one or more branches, such as: a first branch, which may include a first buffer 706A; a second branch, which may include a second buffer 706B; a third branch, which may include a third buffer 706C; a fourth branch, which may include a fourth buffer 706D; and a fifth branch, which may include a fifth buffer 706E. The first branch may be configured to clock a first SSH 708A, which may be in the first core 704A. The third branch may be configured to clock a second SSH 708B, which may be in the first core 704A. The fourth branch may be configured to clock a third SSH 708C, which may be in the second core 704B. The fifth branch may be configured to clock a fourth SSH 708D in the first core 704A.

The second branch may be configured to split into one or more additional or sub-branches, which may be in the second core 704B, such as: a sixth branch, which may include a sixth buffer 706F; a seventh branch, which may include a seventh buffer 706G; an eighth branch, which may include an eighth buffer 706H; and a ninth branch, which may include a ninth buffer 706J. The sixth branch may be configured to clock a first data de-skewing register 710A. The first data de-skewing register 710A may be interposed in the data path between the first SSH 708A and a fifth SSH 708E, which may be in the third core 704C. The seventh branch may be configured to clock the fifth SSH 708E. The eighth branch may be configured to clock a second data de-skewing register 710B. The second data de-skewing register 710B may be interposed in the data path between the fifth SSH 708E and a sixth SSH 708F, which may be in the fourth core 704D. The ninth branch may be configured to clock the sixth SSH 708F.

The clock signal branches provided to some SSHs may be further split or branched. For example, the fourth branch may be split in the third SSH 708C into a 10th branch, which may include an 10th buffer 706K, and an 11th branch, which may include an 11th buffer 706L. The 10th branch may be configured to clock first register logic 712A, and the 11th branch may be configured to clock second register logic 712B. In the illustrated example, the third SSH 708C, the 10th buffer 706K, the 11th buffer 706L, the first register logic 712A, and the second register logic 712B may all be included in a first CSH 714A in the second core 704B.

In the illustrated example, the seventh branch may be split in the fifth SSH 708E into: a 12th branch, which may include a 12th buffer 706M; a 13th branch, which may include a buffer chain 706P comprising any number of individual buffers; a 14th branch, which may include a buffer chain 706Q comprising any number of individual buffers; and a 15th branch, which may include a 13th buffer 706R. The 13th branch may be configured to clock third register logic 712C, and the 15th branch may be configured to clock fourth register logic 712D. In the illustrated example, the fifth SSH 708E, the 12th buffer 706M, the 15th buffer 706R, the third register logic 712C, and the fourth register logic 712D may all be included in a second CSH 714B in the third core 704C.

The 13th branch may be coupled to first functional logic 716A in the third core 704C via a first MUX 718A. The 14th branch may be coupled to second functional logic 716B in the third core 704C via a second MUX 718B. The MUX 718A may be configured to select between clocking the first functional logic 716A using the 13th branch clock signal and clocking the first functional logic 716A using a signal as illustrated. Similarly, the MUX 718B may be configured to select between clocking the second functional logic 716B using the 14th branch clock signal and clocking the second functional logic 716B using another signal as illustrated.

In the illustrated example, the ninth branch may be split in the sixth SSH 708F into: a 16th branch, which may include a 14th buffer 706S; an 17th branch, which may include a buffer chain 706T comprising any number of individual buffers; an 18th branch, which may include a buffer chain 706U comprising any number of individual buffers; and a 19th branch, which may include a 15th buffer 706V. The 16th branch may be configured to clock fifth register logic 712E, and the 19th branch may be configured to clock sixth register logic 712F. In the illustrated example, the sixth SSH 708F, the 14th buffer 706S, the 15th buffer 706V, the fifth register logic 712E, and the sixth register logic 712F may all be included in a third CSH 714C in the fourth core 704D.

The 17th branch may be coupled to third functional logic 716C in the fourth core 704D via a third MUX 718C. The 18th branch may be coupled to fourth functional logic 716E in the fourth core 704C via a fourth MUX 718D. The MUX 718C may be configured to select between clocking the third functional logic 716C using the 18h branch clock signal and clocking the third functional logic 716C using a signal as illustrated. Similarly, the MUX 718D may be configured to select between clocking the fourth functional logic 716D using the 19th branch clock signal and clocking the fourth functional logic 716D using a signal as illustrated.

Figure 8:
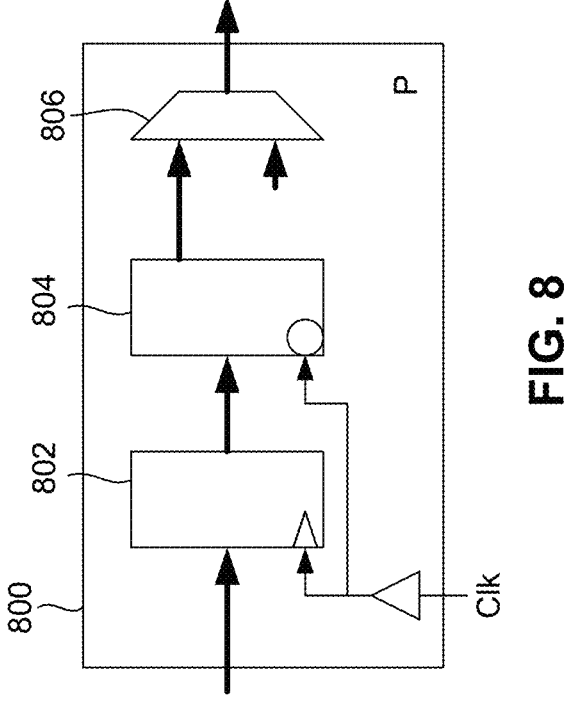
FIG. 8 is a block diagram illustrating data de-skewing logic, in accordance with exemplary embodiments.

In FIG. 8, a data de-skewing register 800 is shown. The data de-skewing register 800 may be an example of each of the above-referenced first data de-skewing register 710A and second data de-skewing register 710B (FIG. 7). A positive edge-clocked register 802 may be configured to receive data as the input to the data de-skewing register 800. A negative edge-clocked register 804 may be configured to receive the output of the positive edge-clocked register 802. A MUX 806 may be configured to receive the output of the negative edge-clocked register 804. The MUX 806 may be configured to select between the output of the negative edge-clocked register 804 and a signal as illustrated. The output of the MUX 806 may be the output of the data de-skewing register 800. A clock buffer 808 may be configured to provide the clock signal to the registers 802 and 804.

Figure 9:
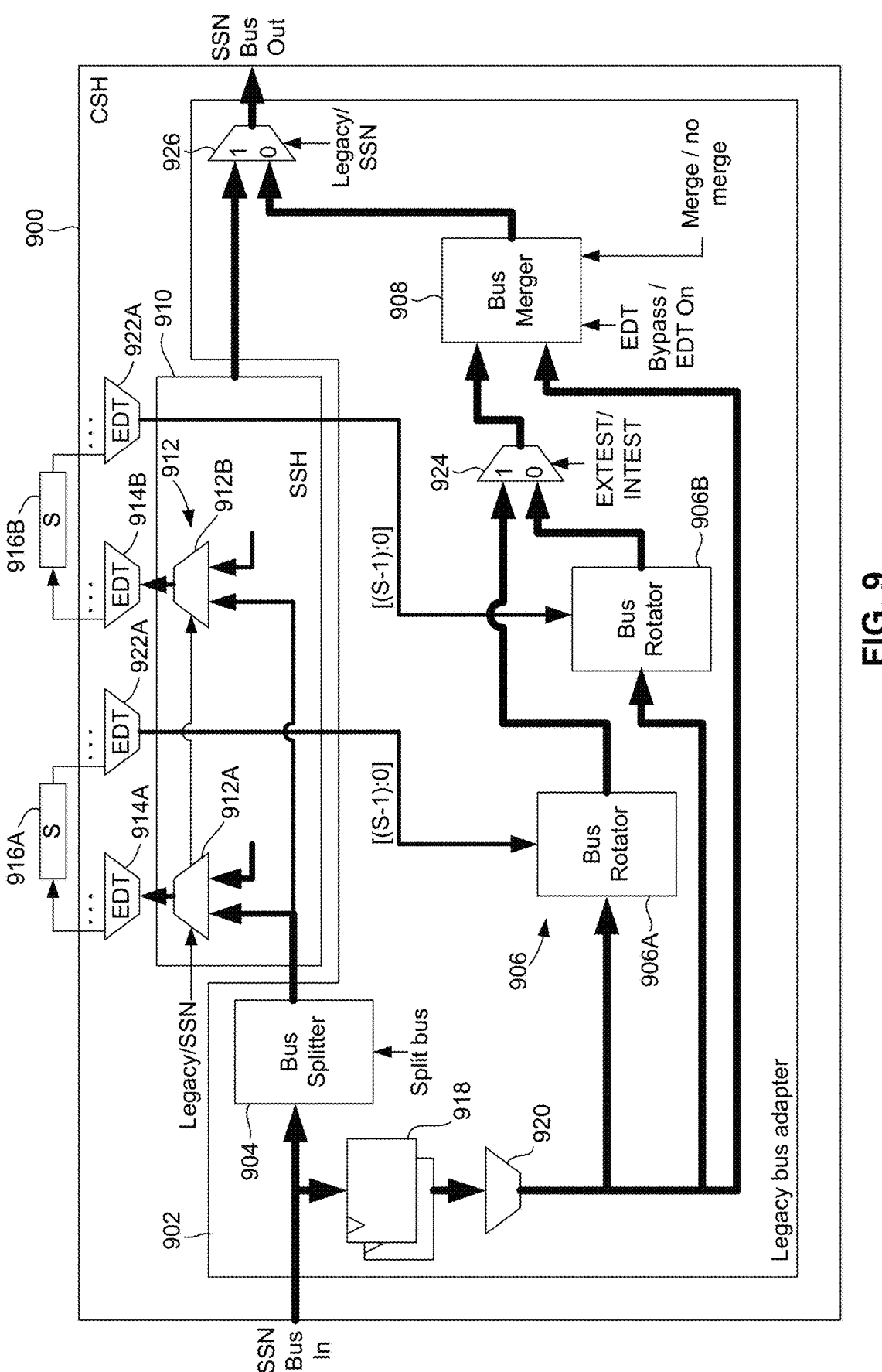
FIG. 9 is a block diagram illustrating a CSH having legacy bus adapter logic, in accordance with exemplary embodiments.

As shown in FIG. 9, a feature may be included in a CSH 900 that may facilitate the use of legacy test vectors. As understood by one of ordinary skill in the art, test vectors may be developed based on scan chain architectures or topologies. The SSN-based "ring" topologies described above with regard to FIGS. 1-3, in which test data and test results propagate or stream through a ring network from one node (e.g., a CSH) to the next, differ from "star" topologies in which test data is provided in parallel streams to multiple nodes and test results are obtained in parallel streams from the multiple nodes. A "legacy" test vector may be a test vector associated with a star network topology or other topology. The feature described herein with regard to FIG. 9 may be included to, in effect, manipulate or reconfigure portions of the SSN bus in a manner that emulates test modes in which legacy test vectors have been used to test other network topologies.

To provide this feature, the CSH 900 may include a legacy bus adapter 902. The legacy bus adapter 902 may include a bus splitter 904, bus rotators 906, such as a first bus rotator 906A and a second bus rotator 906B, and a bus merger 908. The bus splitter 904 may split the SSN bus into a first portion that is provided to the SSH 910 and a second portion that may be manipulated by the bus rotators 906 and bus merger 908.

The SSH 910 may include one or more two-input data MUXes 912, such as an INTEST MUX 912A and an EXTEST MUX 912B. The MUX 912A may be configured to provide test data to an INTEST EDT controller input portion 914A, while the MUX 912B may be configured to provide test data to an EXTEST EDT controller input portion 914B. The EDT controller input portion 914A may be coupled to one or more INTEST scan chains ("S") 916A, while the EDT controller input portion 914B may be coupled to one or more EXTEST scan chains 916B. Except for the additional features described with regard to FIG. 9, the SSH 910 and, more generally, the CSH 900 may be similar to the SSH 402 and CSH 400 (FIG. 4) described above with regard to FIG. 4 or other figures.

The test data provided via the MUX 912A may be provided on a portion of the above-referenced first portion of the SSN bus (split by the bus splitter 904), while the test data provided via the MUX 912A may be provided on another portion of the above-referenced first portion of the SSN bus. The MUXes 912 may be configured to select the first portion of the SSN bus when a "Legacy/SSN mode" signal indicates an SSN mode. The MUXes 912 may be configured to select a legacy scan data bus (not shown) or the high speed scan mode based on the Legacy/SSN mode signal.

One or more registers 918 may be included in the data path that includes the bus rotators 906 and bus merger 908 to adjust the timing. A MUX 920 may be included to select a pipeline or pipeline bypassed path. The output of the MUX 920 may be provided to the bus rotators 906A and 906B as well as the bus merger 908.

The bus rotator 906A may also receive scan chain test result data from the INTEST EDT controller output portion 922A, while the bus rotator 906B may also receive scan chain test result data from the EXTEST EDT controller output portion 922B. For reference purposes, the portion of the SSN bus that the bus rotators 906A and 906 B receive from the respective EDT controller output portions 922A and 922B may be referred to as consisting of bits S−1 through 0 of the SSN bus, where the SSN bus is S bits wide. A data MUX 924 may be configured to select the output of the bus rotator 906A when a selection signal indicates INTEST and select the output of the bus rotator 906B when the selection signal indicates EXTEST.

In an example, the SSN bus may be 32 bits wide (i.e., S=32), while in a legacy test mode the EDT controller portions 914A-914B and 922A-922B may only use the 16 least-significant bits ("LSB"s) of the SSN bus to transmit a test vector. In such an example, each of the bus rotators 906 may be configured to "rotate" the 16 most-significant bits ("MSB"s) into the 16 least-significant bit positions, and provide the results to the bus merger 908, which may re-assemble or merge the results into a reconfigured version of the SSN bus. EDTBypass/EDT ON indicates if the design should operate in the Scan compression & decompression mode, OR in the uncompressed scan mode. "Merge/No Merge" indicates if the output should be merged into a narrower set of outputs.

A MUX 926 may be included to select this reconfigured version of the SSN bus provided by the bus merger 908 when the Legacy/SSN mode signal indicates the legacy test mode. The MUX 926 may select the output of the SSH 910 when the Legacy/SSN mode signal indicates the SSN test mode.

Figure 10:
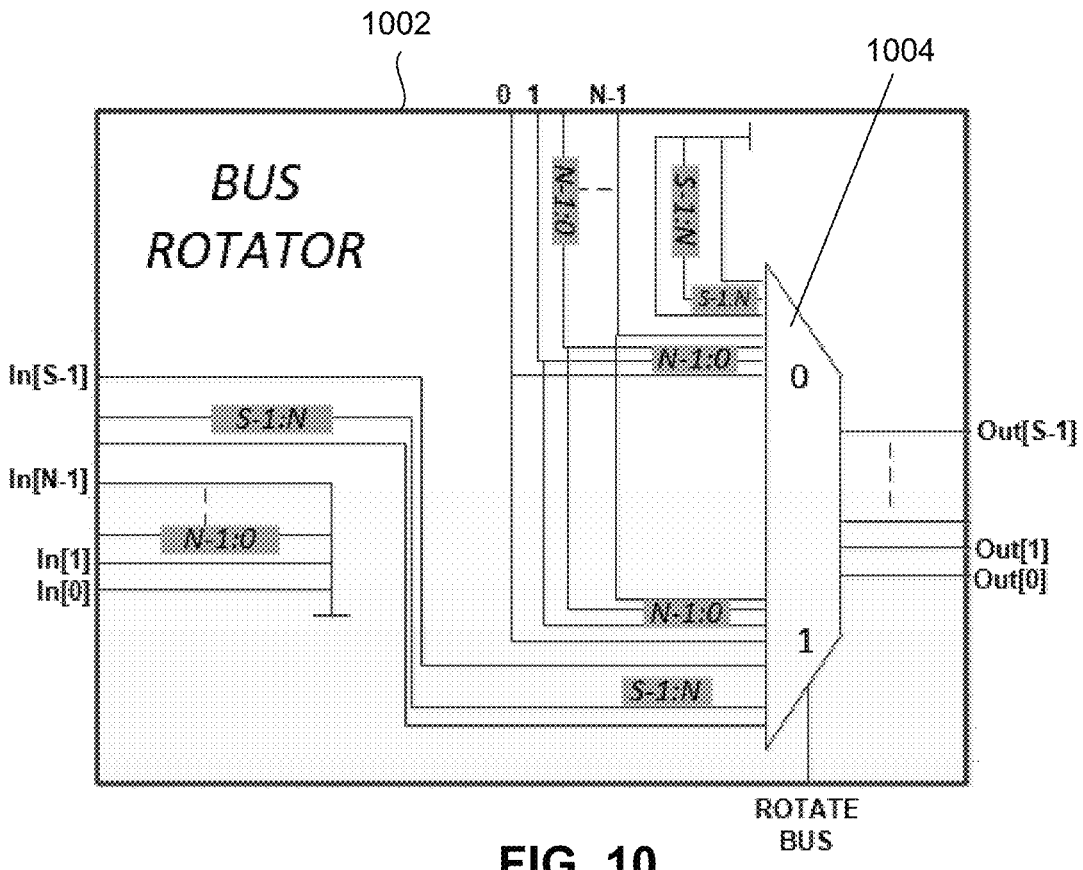
FIG. 10 is a block diagram illustrating a bus rotator of the legacy bus adapter logic of FIG. 9, in accordance with exemplary embodiments.

In FIG. 10, a bus rotator 1002 may be an example of the above-described bus rotators 906 (FIG. 9). The bus rotator 1002 may comprise multiplexing logic 1004. The inputs to the multiplexing logic may consist of the (S−1)th through (N−1)th bits of input bus "In" that is the input to the bus rotator 1002: In [(S−1): 0]. The (N−1)th through 0th bits of that input bus are not used. When a "rotate bus" signal is asserted, indicating the legacy test mode, the lower bits of the bus are rotated so that they occupy the MSB positions. The LSB of the bus is freed up to be used by the next core. When the rotate bus signal is not asserted, indicating the SSN test mode, "the bus is preserved and not rotated."

Figure 11:
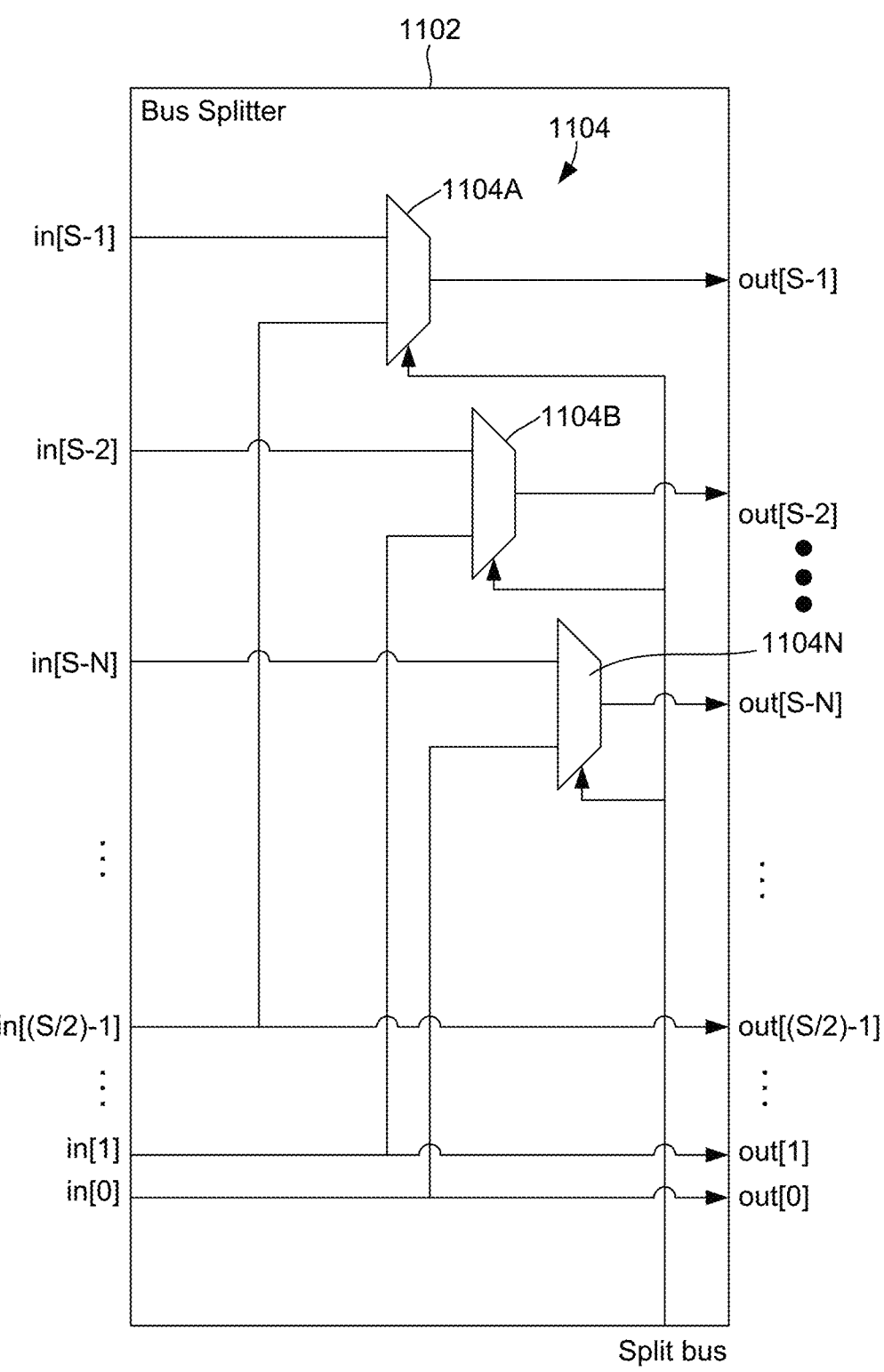
FIG. 11 is a block diagram illustrating a bus splitter of the legacy bus adapter logic of FIG. 9, in accordance with exemplary embodiments.

In FIG. 11, a bus splitter 1102 may be an example of the above-described bus splitter 904 (FIG. 9). The bus splitter 1102 may be configured to split an input bus In, consisting of bits In [(S/2)-1] through In [0], into a first portion consisting of the LSBs In [(S/2)-1] through In [0] and a second portion consisting of the remainder of the S bits, i.e., the MSBs. The first portion may be referred to as Out [(S/2)-1:0]. In the bus splitter 1102, the input bus LSBs In [(S/2-1:0] may become the output bus LSBs Out [(S/2)-1:0]. The output bus MSBs may be provided by MUXes 1104A, 1104B, 1104N, etc. The first input of each MUX 1104A, 110B, 1104N, etc., may be coupled a corresponding bit of the input bus between In [S−1] and In [(S/2)-1]. The second input of each MUX 1104A, 1104B, 1104N, etc., may be coupled to the corresponding bits of the input bus between In [(S/2)-1] and In [0]. All of the MUXes 1104A, 1104B, 1104N, etc., may be controlled by a "split bus" signal. When the split bus signal is asserted, indicating that the bus is to be split, the MUXes 1104A, 1104B, 1104N, etc., may select their first inputs. When the split bus signal is not asserted, indicating that the bus is not to be split, the MUXes 1104A, 1104B, 1104N, etc., may select their second inputs.

Figure 12:
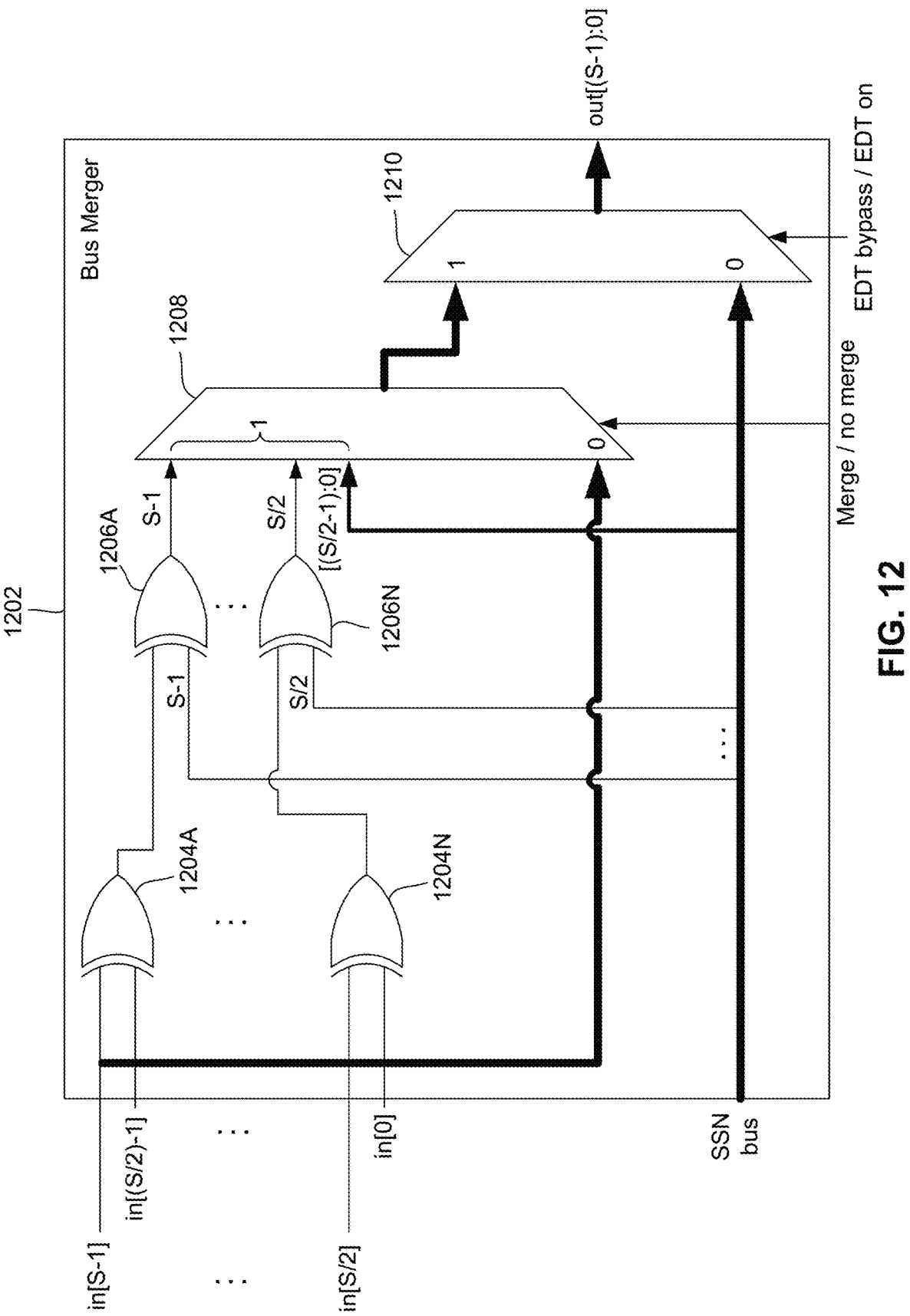
FIG. 12 is a block diagram illustrating a bus merger of the legacy bus adapter logic of FIG. 9, in accordance with exemplary embodiments.

In FIG. 12, a bus merger 1202 may be an example of the above-described bus merger 908 (FIG. 9). The bus merger 1202 may be combine or merge a first bus In [(S−1):(S/2)] and a second bus In [(S/2)-1:0] to form an output bus Out [(S−1): 0]. Each of a number of two-input exclusive-OR ("XOR") gates 1204A-1204N may be configured to perform an XOR operation on one bit of the first bus and one bit of the second bus. Each of a number of other two-input XOR gates 1206A-1206N may be configured to perform an XOR operation on the output of one of the XOR gates 1204A-1204N and one of bits S−1 through S/2 of the SSN bus (where the SSN bus consists of all S bits.

The bus merger 1202 may further includes a first data MUX 1208 controlled by a signal "Merge/no merge." A first input of the first data MUX 1208 may consist of an MSB portion formed by the outputs of the XOR gates 1206A-1206N and an LSB portion formed by the bits [(S/2-1:0] of the SSN bus. When the control signal indicates to merge, the first data MUX 1208 may select this first input. A second input of the first data MUX 1208 may consist of the bits In [(S−1): 0]. When the control signal indicates no merge, the first data MUX 1208 may select this second input. The output of the first data MUX 1208 may be coupled to a first input of a second two-input data MUX 1210. The entire SSN bus, i.e., bits S–1 through 0, may be provided to the second input of the second data MUX 12010. The second data MUX 1208 may be configured to select either the output of the first data MUX 1208 or the SSN bus in response to a control signal "EDT Bypass/EDT on." When this control signal indicates to bypass EDT testing, the second data MUX 1210 may select the combined bus, i.e., the output of the first data MUX 1208. When this control signal indicates that EDT testing is on or to be performed, the second data MUX 1210 may select the SSN bus.

Figure 13:
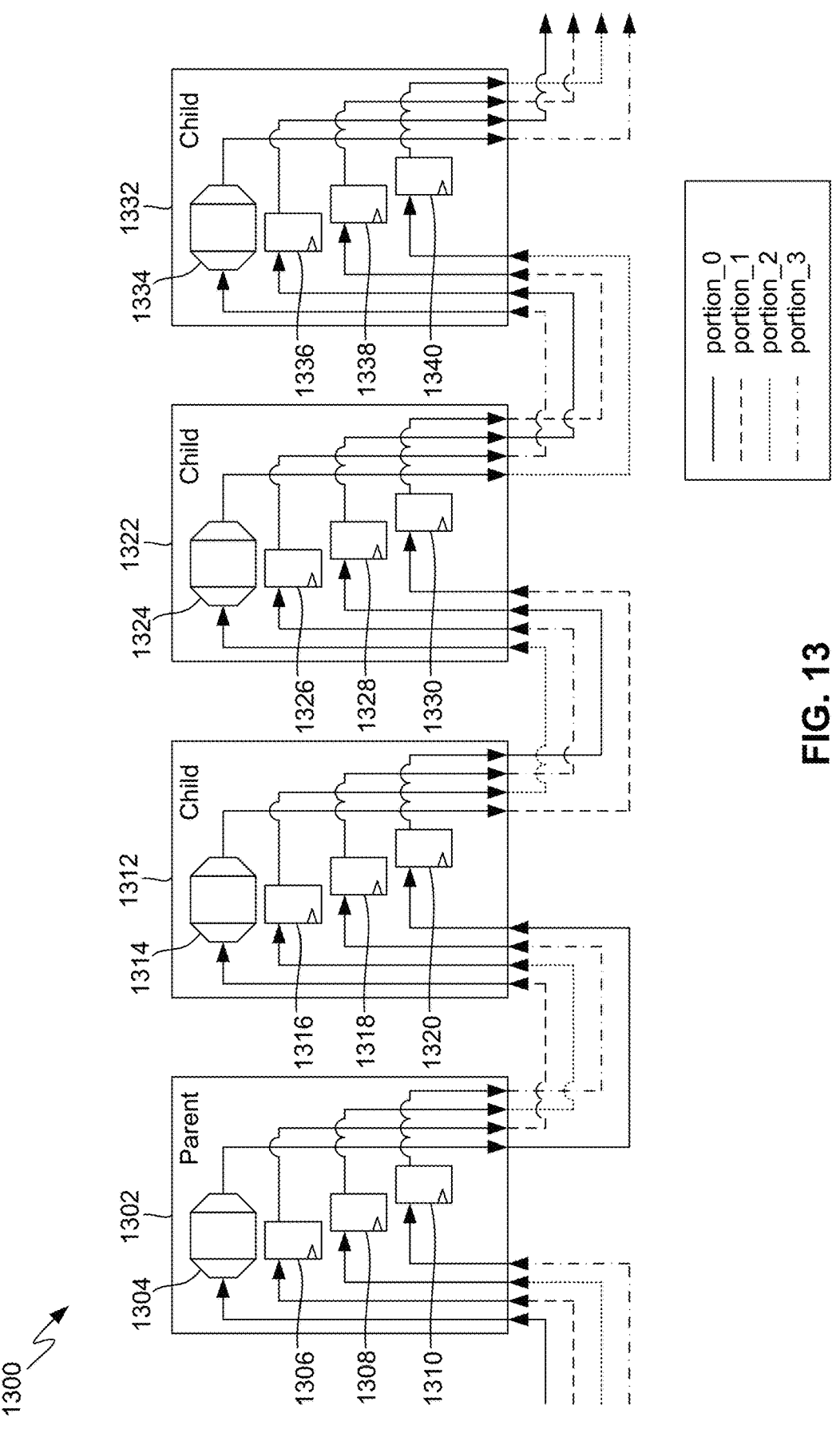
FIG. 13 is a block diagram illustrating a bus rotation operation among cores, in accordance with exemplary embodiments.
Figure 14:
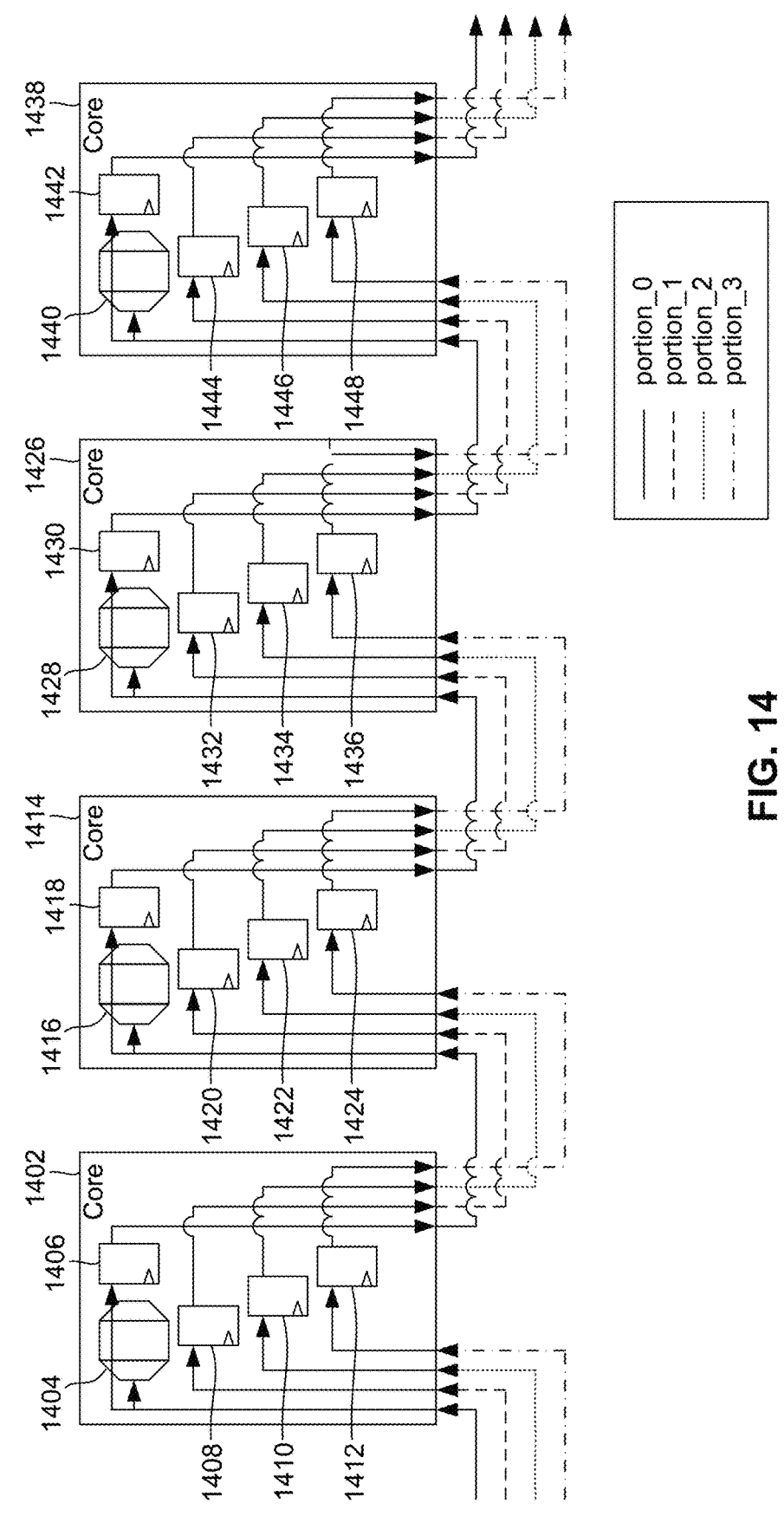
FIG. 14 is a block diagram illustrating a bus splitting operation among cores, in accordance with exemplary embodiments.
Figure 15:
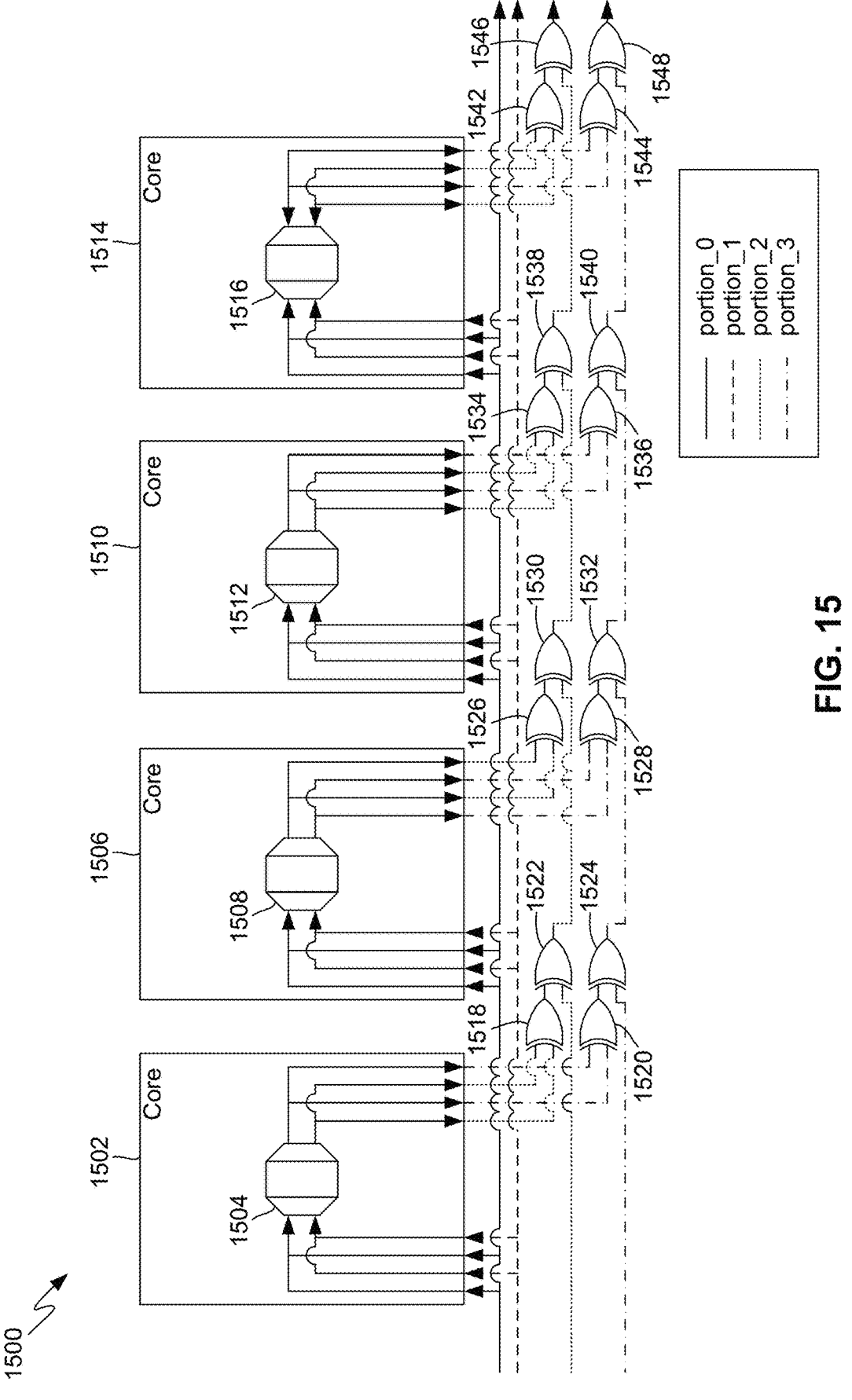
FIG. 15 is a block diagram illustrating another bus splitting operation, where the bus is split into input and observation portions, in accordance with exemplary embodiments.

In FIGS. 13-15, examples of how portions of the SSN bus may be manipulated or reconfigured to facilitate legacy SoC test methods are shown. In FIGS. 13-15, the SSN bus is depicted in four portions: a first portion ("portion_0"), a second portion ("portion_1, a third portion ("portion_2") and a fourth portion ("portion_3"). In an example in which the SSN bus is 32 bits wide, each portion may consist of a group of eight bits.

In FIG. 13, a system 1300 may include a parent core 1302 having an EDT path 1304, a first register logic path 1306, a second register logic path 1308, and a third register logic path 1310. Although not separately shown for purposes of clarity, the EDT path 1304 may include an EDT controller and scan chains as described above with regard to FIG. 1, for example. The system 1300 may also include a first child core 1312 having an EDT path 1314, a first register logic path 1316, a second register logic path 1318, and a third register logic path 1320. The system 1300 may further include a second child core 1322 having an EDT path 1324, a first register logic path 1326, a second register logic path 1328, and a third register logic path 1330. The system 1300 may still further include a third child core 1332 having an EDT path 1334, a first register logic path 1336, a second register logic path 1338, and a third register logic path 1340. Although not shown in FIG. 13 for purposes of clarity, each of the cores 1304, 1312, 1322 and 1332 may include the legacy bus adapter 902, including the bus splitter 904, bus rotators 906 and bus merger 908, described above with regard to FIG. 9. In the example shown in FIG. 13, the legacy bus adapter 902 may be configured to use different portions of the SSN bus to communicate with the different cores 1304, 1312, 1322 and 1332 when the legacy mode is selected and use the entire SSN bus to communicate with all cores 1304-1332 when the SSN mode is selected.

Through the bus rotation feature described above with regard to FIG. 10, the EDT path 1324 in the parent core 1302 may be provided with the first portion of the SSN bus, and: following the output of the EDT path 1324 that first portion of the SSN bus may be rotated to a different position in the SSN bus and passed through the third register logic path 1320 in the first child core 1312; following the output of the third register logic path 1320 in the first child core 1312 that first portion of the SSN bus may be rotated to another position in the SSN bus and passed through the second register logic path 1328 in the second child core 1322; following the output of the second register logic path 1328 in the second child core 1322 that first portion of the SSN bus may be rotated to another position in the SSN bus and passed through the first register logic path 1336 in the third child core 1332.

Similarly, through the bus rotation feature the second portion of the SSN bus may be passed through the first register logic path 1306 in the parent core 1302; following the output of the first register logic path 1306 in the parent core 1302 that second portion of the SSN bus may be rotated to another position in the SSN bus and passed through the EDT path 1314 in the first child core 1312; following the output of the EDT path 1314 in the first child core 1312 that second portion of the SSN bus may be rotated to another position in the SSN bus and passed through the third register logic path 1330 in the second child core 1322; and following the output of the third register logic path 1330 in the second child core 1322 that second portion of the SSN bus may be rotated to another position in the SSN bus and passed through the second register logic path 1338 in the third child core 1332.

Also through the bus rotation feature, the third portion of the SSN bus may be passed through the second register logic path 1308 in the parent core 1302; following the output of the second register logic path 1308 in the parent core 1302 that third portion of the SSN bus may be rotated to another position in the SSN bus and passed through the first register logic path 1316 in the first child core 1312; following the output of the first register logic path 1316 in the first child core 1312 that third portion of the SSN bus may be rotated to another position in the SSN bus and passed through the EDT path 1324 in the second child core 1332; and following the output of the EDT path 1324 in the second child core 132 that third portion of the SSN bus may be rotated to another position in the SSN bus and passed through the third register logic path 1340 in the third child core 1332.

Likewise through the bus rotation feature, the fourth portion of the SSN bus may be passed through the third register logic path 1310 in the parent core 1302; following the output of the i.e. third register logic path 1310 in the parent core 1302 that fourth portion of the SSN bus may be passed through the second register logic path 1318 in the first child core 1312; following the output of the second register logic path 1318 in the first child core 1312 that fourth portion of the SSN bus may be passed through the first register logic path 1326 in the second child core 1322; and following the output of the first register logic path 1326 in the second child core 1322 that fourth portion of the SSN bus may be passed through the EDT path 1334 in the third child core 1332.

In FIG. 14, a system 1400 may include a first core 1402 having an EDT path 1404, an EDT path register 1406, a first register logic path 1408, a second register logic path 1410, and a third register logic path 1412. The system 1400 may also include a second core 1414 having an EDT path 1416, an EDT path register 1418, a first register logic path 1420, a second register logic path 1422, and a third register logic path 1424. The system 1400 may further include a third core 1426 having an EDT path 1428, an EDT path register 1430, a first register logic path 1432, a second register logic path 1434, and a third register logic path 1436. The system 1400 may still further include a fourth core 1438 having an EDT path 1440, an EDT path register 1442, a first register logic path 1444, a second register logic path 1446, and a third register logic path 1448. Although not shown in FIG. 14 for purposes of clarity, each of the cores 1402, 1414, 1426 and 1438 may include the legacy bus adapter 902, including the bus splitter 904, bus rotators 906 and bus merger 908, described above with regard to FIG. 9. In the example shown in FIG. 14, the legacy bus adapter 902 may be configured to use the same portions of the SSN bus to communicate with each of the cores 1402, 1414, 1426 and 1438. In contrast with the bus rotation technique described above with regard to FIG. 13, this technique may be referred to as a bus broadcast technique. In this technique, the same data may be, in effect, broadcast to all of the cores 1402, 1414, 1426 and 1438.

In the example of a broadcast technique shown in FIG. 14, the first portion of the SSN bus may be passed through the EDT path 1404 and EDT path register 1406 of the first core 1402, followed by the EDT path 1416 and EDT path register 1418 of the second core 1414, followed by the EDT path 1428 and EDT path register 1430 of the third core 1426, followed by the EDT path 1440 and EDT path register 1442 of the fourth core 1438. This shows two paths: One going into the EDT, and the same path is also going out of the core. EDT output is not observed. Hence, the input going into the EDT is also sent out to the next core. In essence, the same set of inputs is broadcast to all cores as understood by one of ordinary skill in the art.

Similarly, the second portion of the SSN bus may be passed through the first register logic path 1408 of the first core 1402, followed by the first register logic path 1420 of the second core 1414, followed by the first register logic path 1432 of the third core 1426, followed by the first register logic path 1444 of the fourth core 1438. The third portion of the SSN bus may be passed through the second register logic path 1410 of the first core 1402, followed by the second register logic path 1422 of the second core 1414, followed by the second register logic path 1434 of the third core 1426, followed by the second register logic path 1446 of the fourth core 1438. The fourth portion of the SSN bus may be passed through the third register logic path 1412 of the first core 1402, followed by the third register logic path 1424 of the second core 1414, followed by the third register logic path 1436 of the third core 1426, followed by the third register logic path 1448 of the fourth core 1438.

In the broadcast technique described above with regard to FIG. 14, test data may be transferred from the SSN bus to EDT paths using only a portion of the SSN bus, and test results may be transferred from the EDT paths to the SSN bus using the same portion of the SSN bus. In another broadcast technique, which may be referred to as "broadcast/observe," a portion of the SSN bus may be used to transfer test data from the SSN bus to the EDT paths, and another portion of the SSN bus may be used to observe or transfer test results from the EDT paths to the SSN bus.

In FIG. 15, a system 1500 may include a first core 1502 having an EDT path 1504, a second core 1506 having an EDT path 1508, a third core 1510 having an EDT path 1512, and a fourth core 1514 having an EDT path 1516. Although not shown in FIG. 15 for purposes of clarity, each of the cores 1502, 1506, 1510 and 1514 may include the legacy bus adapter 902, including the bus splitter 904, bus rotators 906 and bus merger 908, described above with regard to FIG. 9. The legacy bus adapter 902 may be configured to use one portion of the SSN bus to transfer or broadcast test data from the SSN bus to all of the cores 1502, 1506, 1510 and 1514 and use another portion of the SSN bus to transfer test results from all of the cores 1502, 1506, 1510 and 1514 to the SSN bus.

In the first core 1502, the first and second portions of the SSN are provided to the inputs of the EDT path 1504. The outputs of the EDT path 1504 are provided to the inputs of two XOR gates 1518 and 1520. Another XOR gate 1522 performs an XOR operation on the output of the XOR gate 1518 and the third portion of the SSN bus. A further XOR gate 1524 performs an XOR operation on the output of the XOR gate 1520 and the fourth portion of the SSN bus. In the second core 1506, the first and second portions of the SSN are provided to the inputs of the EDT path 1508. The outputs of the EDT path 1508 are provided to the inputs of two XOR gates 1526 and 1528. Another XOR gate 1530 performs an XOR operation on the output of the XOR gate 1528 and the output of the XOR gate 1522. A further XOR gate 1532 performs an XOR operation on the output of the XOR gate 1528 and the output of the XOR gate 1524. In the third core 1510, the first and second portions of the SSN are provided to the inputs of the EDT path 1512. The outputs of the EDT path 1512 are provided to the inputs of two XOR gates 1534 and 1536. Another XOR gate 1538 performs an XOR operation on the output of the XOR gate 1534 and the output of the XOR gate 1520. A further XOR gate 1540 performs an XOR operation on the output of the XOR gate 1536 and the output of the XOR gate 1532. In the fourth core 1514, the first and second portions of the SSN are provided to the inputs of the EDT path 1516. The outputs of the EDT path 1516 are provided to the inputs of two XOR gates 1542 and 1544. Another XOR gate 1546 performs an XOR operation on the output of the XOR gate 1542 and the output of the XOR gate 1538. A further XOR gate 1548 performs an XOR operation on the output of the XOR gate 1544 and the output of the XOR gate 1540. The outputs of the XOR gate 1546 and 1548 become the third and fourth portions of the SSN bus at the output of the system 1500. The first and second portions of the SSN bus at the output of the system 1500 are the same as the first and second portions of the SSN bus at the input of the system 1500, i.e., they are passed through the system 1500.

Figure 16:
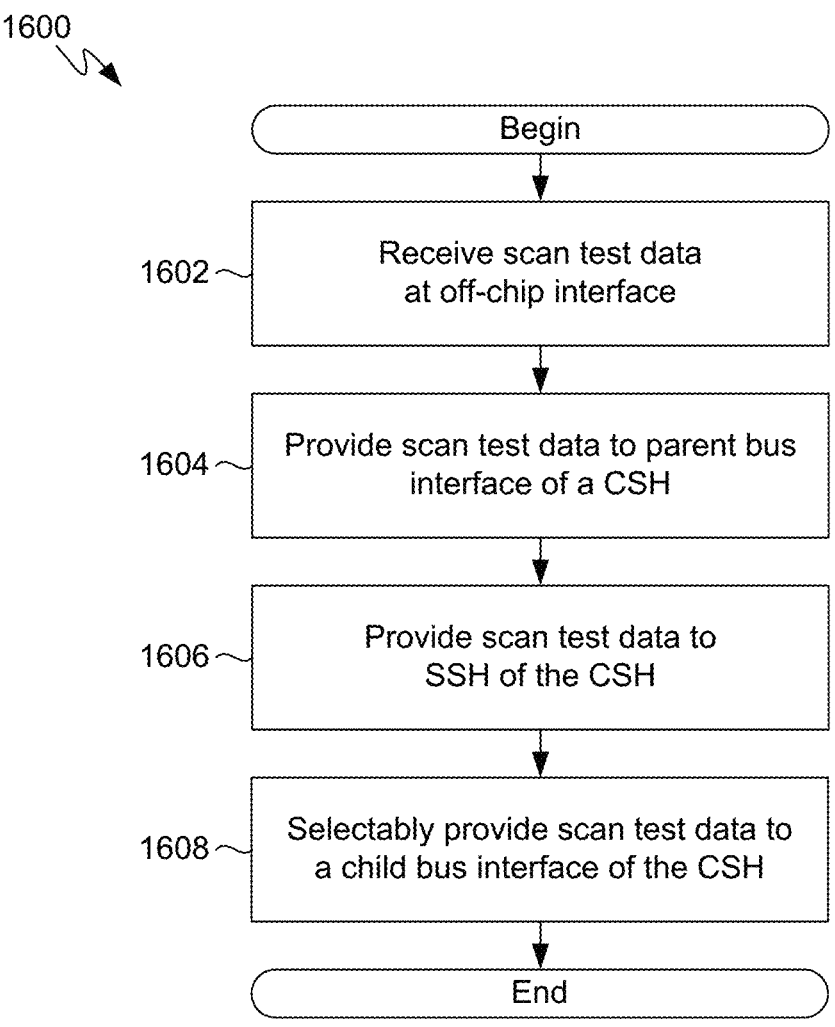
FIG. 16 is a flow diagram illustrating a method for scan testing on a chip, such as an SoC.

As shown in FIG. 16, a method 1600 for scan testing on an integrated circuit chip, such as an SoC, may include the following. As indicated by block 1602, the method 1600 may include receiving scan test data at an off-chip interface of the chip. Advantageously, the scan test data may be transferred onto the chip and through the SSN at a higher speed than the speed at which the functional logic is clocked during testing, thereby improving throughput.

As indicated by block 1604, the method 1600 may also include providing the scan test data to a parent bus interface of an exemplary CSH on the chip. The CSH may be part of an SSN on the chip, and the SSN may include other CSHs that behave similarly to the exemplary CSH now described with regard to the method 1600. The aforementioned scan test data may be in the form of a stream of network data packets.

As indicated by block 1606, the method 1600 may further include providing the scan test data to an SSH of the CSH. The SSH may transmit chip test scan data to, and receive chip test scan results from, a test controller, such as an EDT controller, coupled to scan chains of the functional logic under test.

As indicated by block 1608, the method 1600 may still further include selectably also providing the scan test data that is provided to the SSH to a child bus interface of the CSH. As described above with regard to FIG. 3, such selectability, i.e., whether the scan test data is also provided to the child bus interface, may be provided through a scan control network or SCN that is separate from the SSN. This selectability may enable a hierarchy of CSHs. That is, multiple CSHs may be configured in the SSN in a parent-child hierarchy. In this manner, any number of child, grandchild, etc., CSHs may be configured in a hierarchical arrangement. Scan test data may be streamed through the SSN to a destination CSH anywhere in the hierarchy, and the destination CSH may use the scan test data to perform scan testing on functional logic to which that CSH is coupled.

Although not shown in FIG. 16, data relating to results of scan testing may be obtained in a similar manner. For example, the CSH may obtain scan test results from its associated SSH. The CSH may packetize scan test results obtained from its associated SSH and output the resulting data packets to the SSN (e.g., forward the data packets to the next CSH in the SSN hierarchy) via the parent bus interface. The CSH may also receive data packets containing scan test results via its child bus interface (from a child CSH) and forward or otherwise output those data packets to the SSN. In this manner, scan test results may be streamed from a CSH anywhere in the hierarchy and ultimately transferred off the chip through the off-chip interface.

Implementation examples are described in the following numbered clauses:

1. A system for scan testing on an integrated circuit chip, comprising:

a streaming scan bus; and a plurality of core streaming scan hubs (CSHs) coupled in a ring topology by portions of the streaming scan bus and forming a ring data network with the streaming scan bus, the plurality of CSHs including a first CSH and a second CSH, each of the CSHs having a parent bus interface and a child bus interface, each of the CSHs having a streaming scan hub (SSH) coupled to the parent bus interface and configured to transmit chip test scan data to and receive chip test scan results from a test controller, each of the CSHs having multiplexing logic configured to selectably include the child bus interface in the ring data network and selectably exclude the child bus interface from the ring data network, the parent bus interface of the first CSH coupled to an off-chip interface.

2. The system of clause 1, wherein the ring data network further includes a third CSH, the parent bus interface of the third CSH coupled to the child bus interface of one of the first and second CSHs.

3. The system of clauses 1-2, wherein the multiplexing logic of each CSH includes a plurality of child bypass multiplexers, each of the child bypass multiplexers having a first input coupled to a child data output node of the child bus interface and a second input coupled to a child data input node of the child bus interface, each of the child bypass multiplexers configured to selectably include the child data input node and the child data output node in the ring data network and selectably exclude the child data input node and the child data output node from the ring data network.

4. The system of clauses 1-3, wherein the chip has a plurality of subsystems, the second CSH is included in one of the subsystems, and the one of the subsystems further includes subsystem bypass logic coupled to the second CSH and configured to selectably include the second CSH in the ring data network and selectably exclude the second CSH from the ring data network.

5. The system of clause 4, wherein the subsystem bypass logic includes data de-skewing first-in-first-out (FIFO) logic.

6. The system of clauses 1-5, wherein each of the plurality of subsystems includes clock signal distribution circuitry configured to receive a clock signal from a previous subsystem and forward the clock signal to a next subsystem, and wherein the data de-skewing FIFO logic is clocked by a forwarded clock signal.

7. The system of clauses 1-6, further comprising a plurality of bus adapters, each bus adapter coupled to one of the CSHs and configured to provide a first portion of the streaming scan bus to the one of the CSHs and a second portion of the streaming scan bus to another CSH in the ring data network.

8. The system of clause 7, wherein the bus adapter includes a bus rotator configured to rotate the second portion of the streaming scan bus from a first position in the bus to a second position in the bus.

9. A method for scan testing on an integrated circuit chip, comprising: receiving scan test data by an off-chip interface of the chip; providing the scan test data to a parent bus interface of a first core streaming scan hub (CSH) of a ring data network, the ring data network comprising a plurality of CSHs, including the first CSH and a second CSH, coupled in a ring topology with a streaming scan bus; providing the scan test data from the parent bus interface to a streaming scan hub (SSH) of the first CSH; selectably providing the scan test data in the first CSH to a child bus interface of the first CSH, including configuring multiplexing logic of the first CSH to selectably include the child bus interface of the first CSH in the ring data network and selectably exclude the child bus interface of the first CSH from the ring data network.

10. The method of clause 9, further comprising coupling the parent bus interface of a third CSH in the ring data network to the child bus interface of one of the first CSH and the second CSH.

11. The method of clauses 9-10, further comprising selectably configuring child bypass multiplexers of the multiplexing logic of each CSH to include the child data input node and the child data output node in the ring data network or exclude the child data input node and the child data output node from the ring data network.

12. The method of clauses 9-11, further comprising configuring subsystem bypass logic in one of a plurality of subsystems to selectably include the second CSH in the ring data network and selectably exclude the second CSH from the ring data network, wherein the second CSH is included in the one of the plurality of subsystems.

13. The method of clauses 9-12, further comprising de-skewing received data using first-in-first-out (FIFO) logic in the subsystem bypass logic.

14. The method of clause 13, further comprising receiving a clock signal from a previous subsystem and forwarding the clock signal clock signal through clock distribution circuitry of each of the plurality of subsystems, and further comprising clocking the FIFO logic using a forwarded clock signal.

15. The method of clauses 9-14, further comprising configuring a plurality of bus adapters, each bus adapter coupled to one of the CSHs and configurable to provide a first portion of the streaming scan bus to the one of the CSHs and a second portion of the streaming scan bus to a next CSH in the ring data network.

16. The method of clauses 15, wherein configuring the bus adapters includes configuring a bus rotator to rotate the second portion of the streaming scan bus from a first position in the bus to a second position in the bus.

17. A core streaming scan hub ("CSH") on an integrated circuit chip, comprising: a parent bus interface configured to transmit and receive data via a streaming scan bus; a streaming scan hub ("SSH") coupled to the parent bus interface and configured to transmit chip test scan data to and receive chip test scan results from a test controller; a child bus interface configured to transmit and receive data via a streaming scan bus; and multiplexing logic configured to selectably couple the child bus interface to the parent bus interface and the SSH and selectably isolate the child bus interface from the parent bus interface and the SSH.

18. The CSH of clause 17, wherein the multiplexing logic includes a plurality of child bypass multiplexers, each of the child bypass multiplexers having a first input coupled to a child data output node of the child bus interface and a second input coupled to a child data input node of the child bus interface.

19. The CSH of clauses 17-18, wherein the CSH is included in one of a plurality of subsystems of the integrated circuit chip, and the one of the subsystems further includes subsystem bypass logic coupled to the CSH.

20. The CSH of clause 19, wherein the subsystem bypass logic includes data de-skewing first-in-first-out (FIFO) logic.

21. The CSH of clauses 17-20, further comprising a bus adapter coupled to the CSH and configured to provide a first portion of the streaming scan bus to the CSH and a second portion of the streaming scan bus to another CSH coupled to the CSH via a portion of the streaming scan bus.

22. The system of clause 21, wherein the bus adapter includes a bus rotator configured to rotate the second portion of the streaming scan bus from a first position in the bus to a second position in the bus.

23. A system for scan testing on an integrated circuit chip, comprising: means for receiving scan test data by an off-chip interface of the chip; means for providing the scan test data to a parent bus interface of a first core streaming scan hub (CSH) of a ring data network, the ring data network comprising a plurality of CSHs, including the first CSH and a second CSH, coupled in a ring topology with a streaming scan bus; means for providing the scan test data from the parent bus interface to a streaming scan hub (SSH) of the first CSH; and means for selectably providing the scan test data in the first CSH to a child bus interface of the first CSH, including means for configuring multiplexing logic of the first CSH to selectably include the child bus interface of the first CSH in the ring data network and selectably exclude the child bus interface of the first CSH from the ring data network.

24. The system of clause 23, further comprising coupling the parent bus interface of a third CSH in the ring data network to the child bus interface of one of the first CSH and the second CSH.

25. The system of clauses 23-24, further comprising means for selectably configuring child bypass multiplexers of the multiplexing logic of the CSH.

26. The system of clauses 23-25, further comprising means for selectably bypassing a subsystem containing the CSH from inclusion in the ring data network.

27. The system of clause 26, further comprising means for de-skewing received data using first-in-first-out (FIFO) logic in the subsystem bypass logic.

28. The system of clause 27, further comprising means for receiving a clock signal from a previous subsystem and forwarding the clock signal clock signal through clock distribution circuitry of each of the plurality of subsystems, and further comprising means for clocking the FIFO logic using a forwarded clock signal.

29. The system of clauses 23-28, further comprising means for configurably adapting the CSH to a bus coupled to the CSH, the means for configurably adapting the CSH including means for selectably providing a first portion of the streaming scan bus to the one of the CSHs and a second portion of the streaming scan bus to a next CSH in the ring data network.

30. The system of clause 29, wherein the means for selectably providing a first portion of the bus to the one of the CSHs and a second portion of the bus to a next CSH in the ring data network includes means for configuring a bus rotator to rotate the second portion of the bus from a first position in the bus to a second position in the bus.

Alternative embodiments will become apparent to one of ordinary skill in the art to which the invention pertains. Therefore, although selected aspects have been illustrated and described in detail, it will be understood that various substitutions and alterations may be made therein.

What is claimed is:

1. A system for scan testing on an integrated circuit chip, comprising:

a streaming scan bus;

a plurality of core streaming scan hubs (CSHs) coupled in a ring topology by portions of the streaming scan bus and forming a ring data network with the streaming scan bus, the plurality of CSHs including a first CSH and a second CSH, each of the CSHs having a parent bus interface and a child bus interface, each of the CSHs having a streaming scan hub (SSH) coupled to the parent bus interface and configured to transmit chip test scan data to and receive chip test scan results from a test controller, each of the CSHs having multiplexing logic configured to selectably include the child bus interface in the ring data network and selectably exclude the child bus interface from the ring data network, the parent bus interface of the first CSH coupled to an off-chip interface; and each CSH comprising a bus adapter, each bus adapter configured to provide a first portion of the streaming scan bus to the one of the CSHs and a second portion of the streaming scan bus to another CSH in the ring data network; each bus adapter includes at least two bus rotators coupled to a bus merger, each bus rotator configured to rotate the second portion of the streaming scan bus from a first position in the bus to a second position in the bus, the bus merger comprising a plurality of exclusive-or gates which are coupled to a multiplexer, the bus adapter supporting legacy test vectors configured for a topology other than the ring topology.

2. The system of claim 1, wherein the ring data network further includes a third CSH, the parent bus interface of the third CSH coupled to the child bus interface of one of the first and second CSHs.

3. The system of claim 1, wherein the multiplexing logic of each CSH includes a plurality of child bypass multiplexers, each of the child bypass multiplexers having a first input coupled to a child data output node of the child bus interface and a second input coupled to a child data input node of the child bus interface, each of the child bypass multiplexers configured to selectably include the child data input node and the child data output node in the ring data network and selectably exclude the child data input node and the child data output node from the ring data network.

4. The system of claim 1, wherein the chip has a plurality of subsystems, the second CSH is included in one of the subsystems, and the one of the subsystems further includes subsystem bypass logic coupled to the second CSH and configured to selectably include the second CSH in the ring data network and selectably exclude the second CSH from the ring data network.

5. The system of claim 4, wherein the subsystem bypass logic includes data de-skewing first-in-first-out (FIFO) logic.

6. The system of claim 5, wherein each of the plurality of subsystems includes clock signal distribution circuitry configured to receive a clock signal from a previous subsystem and forward the clock signal to a next subsystem, and wherein the data de-skewing FIFO logic is clocked by a forwarded clock signal.

7. A method for scan testing on an integrated circuit chip, comprising:

receiving scan test data by an off-chip interface of the chip, the scan test data comprising legacy test vectors configured for a topology other than a ring topology;

providing the scan test data to a parent bus interface of a first core streaming scan hub (CSH) of a ring data network, the ring data network comprising a plurality of CSHs, including the first CSH and a second CSH, coupled in a ring topology with a streaming scan bus; each CSH comprising a bus adapter, each bus adapter configured to provide a first portion of the streaming scan bus to the one of the CSHs and a second portion of the streaming scan bus to another CSH in the ring data network; each bus adapter includes at least two bus rotators coupled to a bus merger, each bus rotator configured to rotate the second portion of the streaming scan bus from a first position in the bus to a second position in the bus, the bus merger comprising a plurality of exclusive-or gates which are coupled to a multiplexer, the bus adapter supporting the legacy test vectors configured for a topology other than the ring topology;

providing the scan test data from the parent bus interface to a streaming scan hub (SSH) of the first CSH;

selectably providing the scan test data in the first CSH to a child bus interface of the first CSH, including configuring multiplexing logic of the first CSH to selectably include the child bus interface of the first CSH in the ring data network and selectably exclude the child bus interface of the first CSH from the ring data network.

8. The method of claim 7, further comprising coupling the parent bus interface of a third CSH in the ring data network to the child bus interface of one of the first CSH and the second CSH.

9. The method of claim 7, further comprising selectably configuring child bypass multiplexers of the multiplexing logic of each CSH to include the child data input node and the child data output node in the ring data network or exclude the child data input node and the child data output node from the ring data network.

10. The method of claim 7, further comprising configuring subsystem bypass logic in one of a plurality of subsystems to selectably include the second CSH in the ring data network and selectably exclude the second CSH from the ring data network, wherein the second CSH is included in the one of the plurality of subsystems.

11. The method of claim 10, further comprising de-skewing received data using first-in-first-out (FIFO) logic in the subsystem bypass logic.

12. The method of claim 11, further comprising receiving a clock signal from a previous subsystem and forwarding the clock signal clock signal through clock distribution circuitry of each of the plurality of subsystems, and further comprising clocking the FIFO logic using a forwarded clock signal.

13. A core streaming scan hub ("CSH") on an integrated circuit chip, comprising:

a parent bus interface configured to transmit and receive data via a streaming scan bus;

a streaming scan hub ("SSH") coupled to the parent bus interface and configured to transmit chip test scan data to and receive chip test scan results from a test controller;

a child bus interface configured to transmit and receive data via a streaming scan bus;

multiplexing logic configured to selectably couple the child bus interface to the parent bus interface and the SSH and selectably isolate the child bus interface from the parent bus interface and the SSH; and a bus adapter configured to provide a first portion of the streaming scan bus to the one of the CSHs and a second portion of the streaming scan bus to another CSH in a ring data network; each bus adapter includes at least two bus rotators coupled to a bus merger, each bus rotator configured to rotate the second portion of the streaming scan bus from a first position in the bus to a second position in the bus, the bus merger comprising a plurality of exclusive-or gates which are coupled to a multiplexer, the bus adapter supporting legacy test vectors for a topology other than a ring topology.

14. The CSH of claim 13, wherein the multiplexing logic includes a plurality of child bypass multiplexers, each of the child bypass multiplexers having a first input coupled to a child data output node of the child bus interface and a second input coupled to a child data input node of the child bus interface.

15. The CSH of claim 13, wherein the CSH is included in one of a plurality of subsystems of the integrated circuit chip, and the one of the subsystems further includes subsystem bypass logic coupled to the CSH.

16. The CSH of claim 15, wherein the subsystem bypass logic includes data de-skewing first-in-first-out (FIFO) logic.

* * * * *